United States Patent
Visconti et al.

(10) Patent No.: US 11,749,330 B2
(45) Date of Patent: Sep. 5, 2023

(54) CHARGE LEAKAGE DETECTION FOR MEMORY SYSTEM RELIABILITY

(71) Applicant: Micron Technology, Inc., Boise, ID (US)

(72) Inventors: Angelo Visconti, Appiano Gentile (IT); Riccardo Pazzocco, Verona (IT); Jonathan J. Strand, Boise, ID (US); Kevin T. Majerus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/053,305

(22) Filed: Nov. 7, 2022

(65) Prior Publication Data
US 2023/0114735 A1   Apr. 13, 2023

Related U.S. Application Data

(63) Continuation of application No. 16/831,524, filed on Mar. 26, 2020, now Pat. No. 11,514,968.

(51) Int. Cl.
*G11C 11/22* (2006.01)
*G11C 29/50* (2006.01)

(52) U.S. Cl.
CPC ........ *G11C 11/2273* (2013.01); *G11C 11/221* (2013.01); *G11C 11/2259* (2013.01); *G11C 11/2275* (2013.01); *G11C 29/50* (2013.01)

(58) Field of Classification Search
CPC .............. G11C 11/2273; G11C 11/221; G11C 11/2259; G11C 11/2275
See application file for complete search history.

(56) References Cited

U.S. PATENT DOCUMENTS

| 8,248,856 | B2 | 8/2012 | Goss et al. |
| 9,633,740 | B1 | 4/2017 | Alhussien et al. |
| 10,445,200 | B2 | 10/2019 | Park et al. |
| 2001/0040836 | A1 | 11/2001 | Mori et al. |

(Continued)

OTHER PUBLICATIONS

International Search Report and Written Opinion received for PCT Patent Application No. PCT/US21/22895, dated Jul. 7, 2021, 7 pages.

*Primary Examiner* — Han Yang
(74) *Attorney, Agent, or Firm* — Holland & Hart LLP

(57) ABSTRACT

Methods, systems, and devices for charge leakage detection for memory system reliability are described. In accordance with examples as disclosed herein, a memory system may employ memory management techniques configured to identify precursors of charge leakage in a memory device, and take preventative action based on such identified precursors. For example, a memory system may be configured to perform a leakage detection evaluation for a memory array, which may include various biasing and evaluation operations to identify whether a leakage condition of the memory array may affect operational reliability. Based on such an evaluation, the memory device, or a host device in communication with the memory device, may take various preventative measures to avoid operational failures of the memory device or host device that may result from ongoing operation of a memory array associated with charge leakage, thereby improving reliability of the memory system.

20 Claims, 7 Drawing Sheets

(56) References Cited

U.S. PATENT DOCUMENTS

| | | | |
|---|---|---|---|
| 2009/0231917 A1* | 9/2009 | Chae | G11C 7/12 |
| | | | 365/185.11 |
| 2010/0054071 A1* | 3/2010 | Maruyama | G11C 29/025 |
| | | | 365/230.03 |
| 2011/0149671 A1 | 6/2011 | Liao | |
| 2019/0198098 A1 | 6/2019 | Yang et al. | |
| 2019/0295610 A1 | 9/2019 | Fantini et al. | |

* cited by examiner

CHARGE LEAKAGE DETECTION FOR MEMORY SYSTEM RELIABILITY

CROSS REFERENCES

The present Application for Patent is a continuation of U.S. patent application Ser. No. 16/831,524 by Visconti et al., entitled "CHARGE LEAKAGE DETECTION FOR MEMORY SYSTEM RELIABILITY", filed Mar. 26, 2020, which is assigned to the assignee hereof, and which is expressly incorporated by reference in its entirety herein.

BACKGROUND

The following relates generally to one or more memory systems and more specifically to charge leakage detection for memory system reliability.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
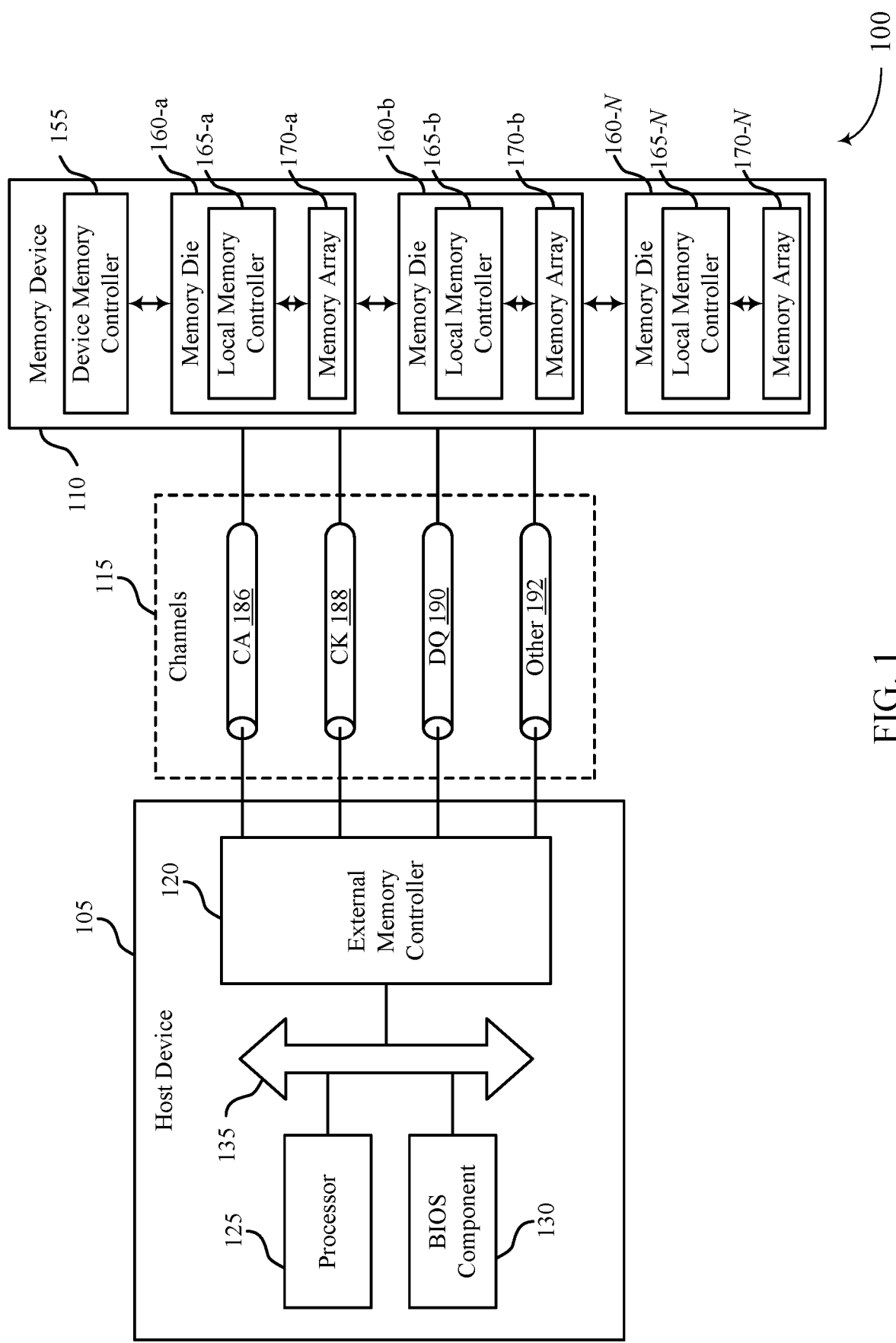
FIG. 1 illustrates an example of a system that supports charge leakage detection for memory system reliability in accordance with examples as disclosed herein.

A memory system in accordance with examples disclosed herein may include a memory device and a host device coupled with the memory device. Reliability of a memory device in such a system may be based on a statistical probability of failures at the memory device, which may be referred to as a failure in time (FIT), or other terminology. Some applications, such as vehicle safety systems, autonomous vehicle systems, advanced driver assistance systems (ADAS) or other safety-critical systems, may have particularly high reliability requirements, or may otherwise involve a particularly low probability of failures.

In some memory systems, reliability may be improved when failures are identified, detected, or otherwise handled. For example, if a memory device experiences one hundred failures in a given duration (e.g., a FIT of 100), but all of the errors are handled without operational failure (e.g., where all the errors are handled by an error correction algorithm), the memory device may be associated with a zero FIT (e.g., a zero "Safety FIT") or other measure of relatively high reliability (e.g., zero parts-per-million (PPM)). In other words, a memory device that employs techniques for reducing uncertainties associated with failures, or identifies precursors of and thus takes a proactive approach with respect to such failures or reliability issues, may have a favorable reliability compared to a memory device that does not employ such techniques.

In some memory devices, charge leakage may be associated with operational failures or reduction in reliability. For example, charge leakage may be superimposed on a signal associated with accessing a memory cell (e.g., reading a memory cell), which may cause a reduction or elimination in read margins (e.g., may impair an ability for a read operation to distinguish between logic states stored at various memory cells). In some circumstances, charge leakage may cause a memory device may detect one logic state when reading a memory cell despite a different logic state having been written to the memory cell (e.g., detecting a logic 0 during a read operation on a memory cell despite that memory cell previously being written with a logic 1), which may be associated with a loss or corruption of stored information. Although some errors may be handled by error handling operations of a memory system, such as an error correction code (ECC) of a memory device or host device, such techniques may not provide insight into underlying reliability issues before such issues exceed an error handling capability or cause other operational problems.

In accordance with examples as disclosed herein, a memory system may employ memory management techniques configured to identify precursors of charge leakage in a memory device, and take preventative action based on such identified precursors. For example, a memory system may be configured to perform a leakage detection evaluation for a memory array, which may include various biasing and evaluation operations to identify whether a leakage condition of the memory array may affect operational reliability. Based on such an evaluation, the memory device, or a host device in communication with the memory device, may take various preventative measures to avoid operational failures of the memory device or host device that may result from ongoing operation of a memory array associated with charge leakage. Thus, in some examples, the described techniques for charge leakage evaluation may improve reliability of a memory device or a memory system as a whole.

Features of the disclosure are initially described in the context of memory systems and dies as described with reference to FIGS. 1-2. Features of the disclosure are described in the context of memory cell characteristics, and associated circuits and access operations, as described with reference to FIGS. 3-5. These and other features of the disclosure are further illustrated by and described with reference to an apparatus diagram and flowcharts that relate to charge leakage detection for memory system reliability as described with references to FIGS. 6 and 7.

FIG. 1 illustrates an example of a system 100 that supports charge leakage detection for memory system reliability in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of a transmission medium that carries information between the host device 105 and the memory device. Each channel 115 may include one or more signal paths or transmission media (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, charge leakage in a memory device 110 may be associated with operational failures or a reduction in reliability of the system 100. For example, charge leakage may be superimposed on a signal associated with accessing a memory cell (e.g., of a memory array 170), which may be associated with a loss or corruption of stored information. In accordance with examples as disclosed herein, the system 100 may employ various memory management techniques configured to evaluate charge leakage in a memory device 110 as a precursor for possible reliability issues (e.g., to proactively address such issues before failures or an excess amount of failures occur), which may include various techniques for biasing, charge integration, and signal comparison, including those described herein. Based on such identified precursors, a memory device 110, or a host device 105, or both, may take various preventative action to prevent or reduce the likelihood of failures, mitigate the impact of failures, or otherwise improve the reliability of the memory device 110 or the system 100 as a whole.

Performing evaluations of a charge leakage condition may be initiated or triggered according to various techniques, including initiation by a memory device 110, a host device 105, or both. In some examples, the described charge leakage evaluations may be performed as part of an access operation, or may incorporate modified aspects of an access operation (e.g., may comprise or be included in a modified read operation, a modified activation (ACT) operation, a modified precharge (PRE) operation, a modified ACT-PRE operation). In some examples, such techniques may leverage biasing levels that are the same as or different than (e.g., less than, greater than) those used in other access operations, or may include operations added to access operations that rely on different delays or asynchronous timings (e.g., relative to a clock cycle or set of clock cycles) compared with other access operations. In some examples, charge leakage evaluations may be integrated into other operations, such as an integration of charge leakage evaluation into a wear-leveling operation or other memory management technique.

In some examples, the described charge leakage evaluations may be performed periodically, such as being performed according to a periodic interval associated with a periodic duration or quantity of access operations. In some examples, the described charge leakage evaluations may be event driven, such as being performed upon power-on or startup of a host device 105 or memory device, according to a built-in self-test (BIST) (e.g., of or internal to a memory device 110), according to a diagnostic mode of a memory device 110 or host device 105, or based on a memory device 110 or host device 105 being in an idle mode or other mode where activity is below some threshold. In some examples, the described charge leakage evaluations may be initiated by a host device 105, and the host device 105 may send a command to one or more memory devices 110 to perform a requested charge leakage evaluation.

A system 100 may be configured for various preventative actions in response to an identified charge leakage of a memory device 110 (e.g., of a memory array 170). In some examples, a memory device 110 or host device 105 may be configured to perform various self-repair operations (e.g., internal remediation performed at a memory device 110, external remediation performed at a host device 105), which may leverage dynamic redundancy at a memory device 110, or dynamic redundancy across more than one memory device 110. In some examples, upon identifying a memory address associated with charge leakage at or above a threshold, a memory device 110 may move or remap information to a different address or otherwise retire such an address, which may include remapping to a different portion of the same memory array 170 or to a different memory array 170 of the same memory device 110. In some examples, such techniques may be performed prior to installation (e.g., prior to coupling with a host device 105), as part of a manufacturing validation or configuration operation. In some examples, such techniques may be performed upon an initial installation or power-on of a memory device as part of a post package repair. In some examples, such operations may be performed dynamically at various points of the operation of the memory device 110.

In some examples, a host device 105 may remap information to a different address or otherwise retire such an address, which may include remapping to a different portion of the same memory array 170, remapping to a different memory array 170 of the same memory device 110, or to a different memory device 110. In some examples, a memory device 110 or host device 105 may store a fault indication, which may include an address of a memory array 170 or a general condition that is associated with charge leakage that meets or exceeds a threshold. In some examples, a memory device 110 may transmit an indication of detected charge leakage to a host device 105, which may support a remapping by the host device 105, an initiation of a diagnostic mode, information transfer mode, or safe mode by the host device 105, or a host device 105 providing an indication to a user that the associated memory array 170 or memory device 110 should be replaced.

Figure 2:
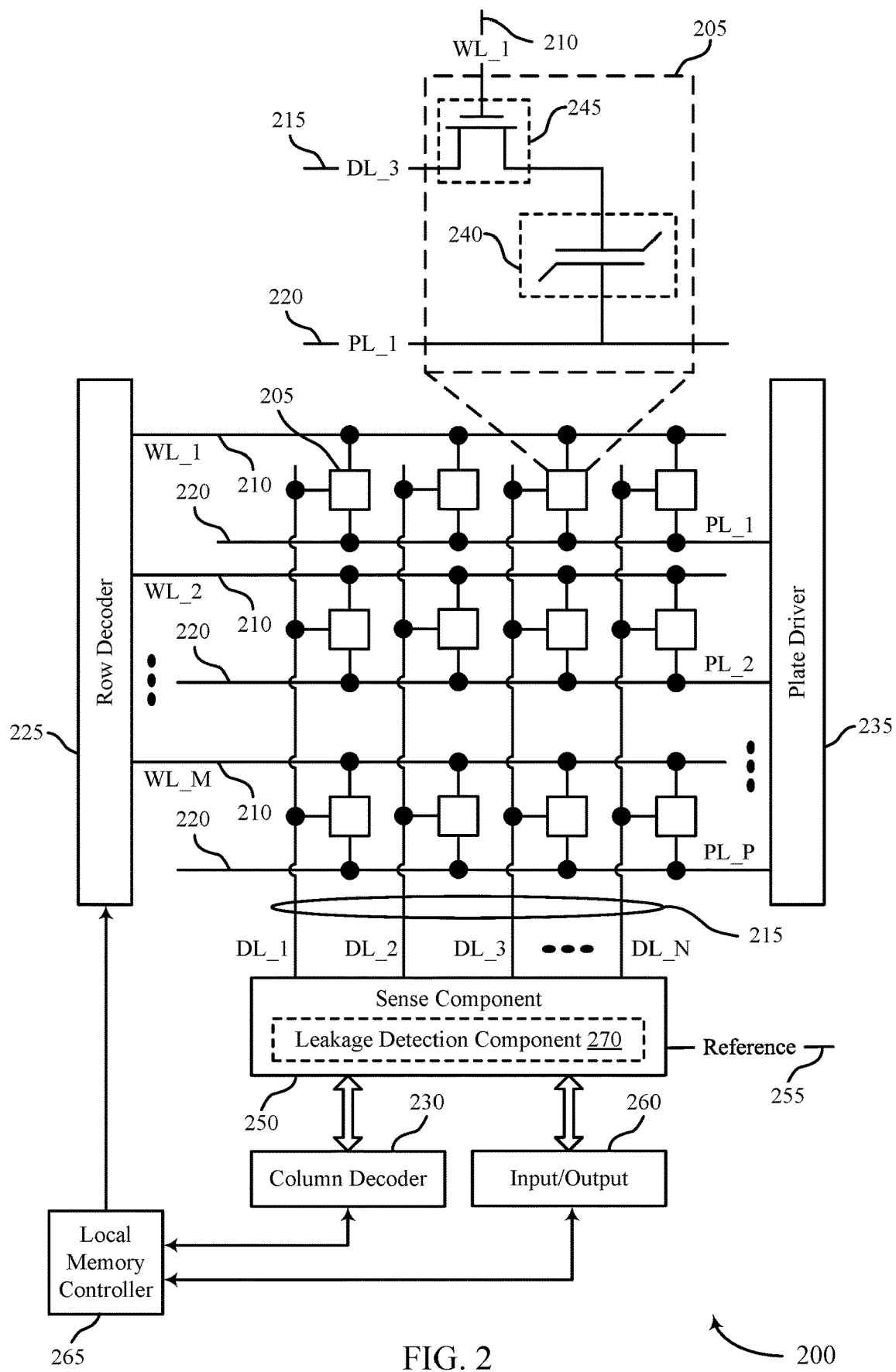
FIG. 2 illustrates an example of a memory die that supports charge leakage detection for memory system reliability in accordance with examples as disclosed herein.

FIG. 2 illustrates an example of a memory die 200 that supports charge leakage detection for memory system reliability in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1. In various examples, the memory cells 205 may include a capacitive storage element, a ferroelectric storage element, a material memory element, a resistive memory element, a thresholding memory element, a phase change memory element, or other types of storage elements.

In some examples, a memory cell 205 may store a state (e.g., a polarization state, a dielectric charge) representative of the programmable states in a capacitor (e.g., capacitor 240). In FeRAM architectures, the memory cell 205 may include a capacitor 240 that includes a ferroelectric material to store a charge and/or a polarization representative of the programmable state. In some examples, a memory cell 205 may include a logic storage component (e.g., capacitor 240) and a switching component 245. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

In some examples, a memory cell 205 may include or otherwise be associated with a configurable material, which may be referred to as a material memory element, a material storage element, a material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold voltages, or other properties that are detectable or distinguishable during a read operation to identify a logic state written to or stored by the configurable material.

In some cases, a configurable material of a memory cell 205 may be associated with a threshold voltage. For example, electrical current may flow through the configurable material when a voltage greater than the threshold voltage is applied across the memory cell 205, and electrical current may not flow through the configurable material, or may flow through the configurable material at a rate below some level (e.g., according to a leakage rate), when a voltage less than the threshold voltage is applied across the memory cell 205. Thus, a voltage applied to memory cells 205 may result in different current flow, or different perceived resistance, or a change in resistance (e.g., a thresholding or switching event) depending on whether a configurable material portion of the memory cell 205 was written with one logic state or another. Accordingly, the magnitude of current, or other characteristic (e.g., thresholding behavior, resistance breakdown behavior, snapback behavior) associated with the current that results from applying a read voltage to the memory cell 205, may be used to determine a logic state written to or stored by memory cell 205.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

In some examples, selecting or deselecting the memory cell 205 may be accomplished by activating or deactivating a switching component 245. The capacitor 240 or other storage element may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor or other storage element of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 or other storage element of the memory cell 205 and the digit line 215. In some architectures, a memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of a capacitor 240. The plate line 220 may cooperate with the digit line 215 to bias the capacitor 240 during access operation of the memory cell 205.

The sense component 250 may be configured to detect a state (e.g., polarization state, charge state, material state) stored at the memory cell 205 and determine a logic state of the memory cell 205 based on the detected state. The sense component 250 may include one or more sense amplifiers to amplify or compare a signal based on accessing the memory cell 205. The sense component 250 may compare the signal received from the memory cell 205 across the digit line 215 to a reference line 255 (e.g., a reference voltage). The detected logic state of the memory cell 205 may be provided as an output of the sense component 250 (e.g., to an input/output component 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. In some examples, the local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference line 255. Based on that comparison, the sense component 250 may determine a logic state that is stored on the memory cell 205.

In some examples, charge leakage in the memory die 200 may be associated with operational failures or reduction in reliability of the memory die 200, or a system 100 that uses the memory die 200 for information storage. For example, charge leakage may be superimposed on a signal used by the sense component 250 to determine a logic state stored at a memory cell 205, which may cause read operation failures associated with a loss or corruption of stored information.

Charge leakage in the memory die 200 may include various examples of charge flow from one portion of the memory die 200 to another. Possible causes of charge leakage include manufacturing defects, component breakdown (e.g., thin film transistor (TFT) breakdown or leakage), memory cell wear-out mechanisms (e.g., stress-induced leakage current (SILC), breakdown (BD) current), changes in material composition of an element of the memory die 200, or other causes. For example, charge may leak across a switching component 245 (e.g., when the switching component 245 is intended to be closed or deactivated), across a dielectric material of a capacitor 240, from one access line of the memory die 200 to another (e.g., from one digit line 215 to another digit line 215, from a digit line 215 to a plate line 220 or word line 210), or along other paths where charge leakage is unintentional or otherwise impairs operation of the memory die 200. In various examples, charge leakage may affect the information state of a memory cell 205 itself, or an ability to generate or detect a signal (e.g., a read signal) resulting from accessing a memory cell 205, either or both of which may be associated with impaired operation of the memory die 200.

In accordance with examples as disclosed herein, the memory die 200 may include one or more leakage detection components, such as the leakage detection component 270, configured to evaluate a presence or level of charge leakage (e.g., a transfer of charge between components intended to be electrically isolated). A leakage detection component 270 may be configured to detect charge leakage in the memory die 200, such as a leakage or other transfer of charge that is above or otherwise satisfies a threshold (e.g., above a threshold that would indicate normal operation of the memory die 200, an amount of charge leakage that indicates abnormal operation of one or more elements of the memory die 200). Although the leakage detection component 270 is illustrated as a component of the sense component 250, a leakage detection component 270 may be included in, or be otherwise within an illustrative boundary of, a local memory controller 265, a row decoder 225, a column decoder 230, a plate driver 235, or some other component of a memory die 200.

In some examples, a leakage detection component 270 may be configured to detect a charge leakage by identifying a change in voltage (e.g., of an access line, of a memory cell 205), or comparing a voltage to a reference voltage or threshold (e.g., using a sense amplifier, a multi-level cell (MLC) latch, a comparator, or other component of the leakage detection component 270). For example, the leakage detection component 270 may be configured to monitor a voltage of a digit line 215 or other access line of the memory die 200. In some examples, a leakage detection component 270 may be configured to detect a flow of charge (e.g., under scenarios or conditions where such a flow of charge, or a flow of charge above a threshold, would indicate leakage rather than charge transfer normally associated with an access operation). For example, the leakage detection component 270 may be configured to detect a flow of charge along a digit line 215 or other access line of the memory die 200, which may correspond to a flow of charge across a portion of the sense component 250. In some examples, detecting a flow of charge may be supported by monitoring a voltage across a shunt resistor configured to convey the flow of charge (e.g., when a leakage detection component 270 is connected in series with an access line or component). In various examples, the leakage detection component 270 may be configured to establish a baseline condition for leakage evaluation that is not dependent on a state (e.g., logic state, charge state, material state) of a memory cell, which may include various examples of writing or otherwise establishing a diagnostic state or diagnostic condition of a memory cell 205. Leakage may be detected, for example, after a memory cell 205 or other aspect of the memory die 200 has been placed in the baseline condition.

In some examples, a leakage detection component 270 may be configured to perform a leakage detection operation during, or otherwise based at least in part on an access operation (e.g., of a memory cell 205), which may include performing a leakage detection operation while the memory cell 205 is selected (e.g., while a switching component 245 is activated, while an associated word line 210 is activated). A leakage detection component 270 may thus be in communication with a local memory controller 265, word line 210, digit line 215, or plate line 220, which may support the leakage detection component 270 performing operations during particular portions of an access operation. In some examples, a leakage detection component 270 may be configured to perform a leakage detection operation during, or otherwise based at least in part on a diagnostic mode of a memory die 200, or system that includes the memory die 200, which may or may not be integrated with an access operation or other memory management operation.

A leakage detection component 270 may provide information to support identifying a memory cell 205, an access line (e.g., a digit line 215), or other indication of an address of the memory die 200 as being associated with charge leakage that meets or exceeds a threshold (e.g., indicating abnormal leakage or other operational abnormality), which may be associated with a precursor of potential reliability issues or downstream memory failures. In some examples, a leakage detection component 270 or other portion of the memory die 200 (e.g., local memory controller 265) may include a storage element (e.g., a temporary storage element, a latch, a capacitor, a storage element) that stores an indication of whether leakage was detected, or an address otherwise associated with such a detection. In some examples, a stored indication may be maintained or otherwise valid for a most-recent access operation, and may or may not be cleared or reset in response to another access being performed.

In accordance with examples as disclosed herein, a memory system that includes the memory die 200 may leverage information provided by a leakage detection component 270 to support various preventative actions in an effort to improve the reliability of the memory die 200 or related system 100 as a whole. In some examples, an indication of whether leakage was detected may be received or requested by a device memory controller 155, and the device memory controller 155 or some other portion of a memory device 110 may use such an indication to support various preventative actions. In some examples, an indication of whether leakage was detected may be received or requested by a host device 105 (e.g., an external memory controller 120), and the host device 105 may use such an indication to support various preventative actions.

Figure 3A:
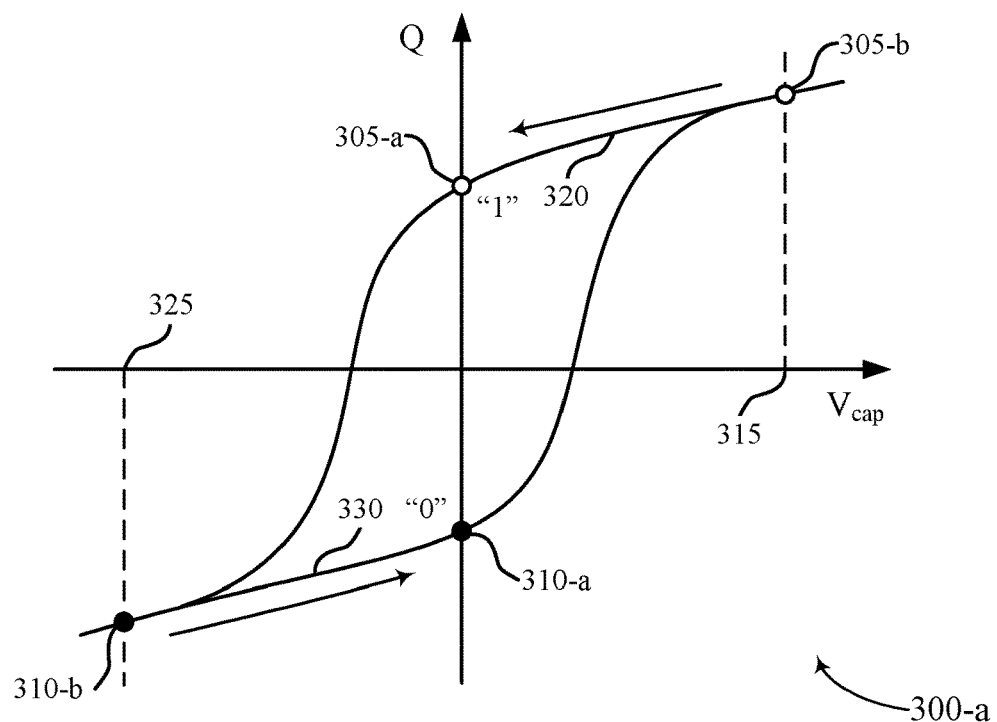
FIGS. 3A and 3B illustrate examples of non-linear electrical properties of a ferroelectric memory cell with hysteresis plots in accordance with various examples as disclosed herein.
Figure 3B:
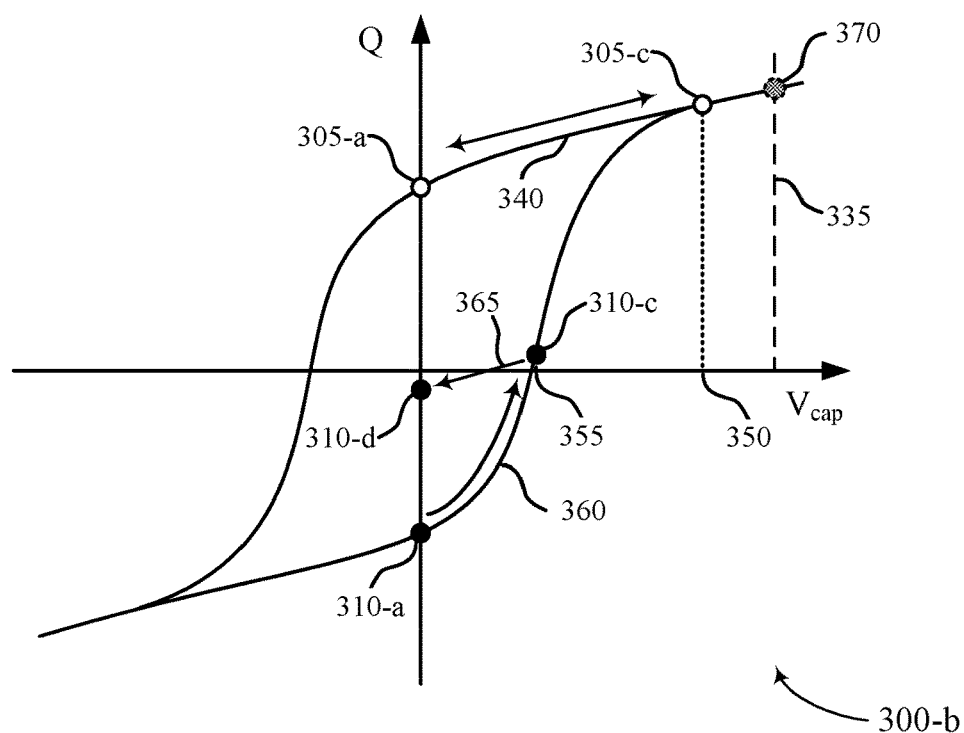

FIGS. 3A and 3B illustrate examples of non-linear electrical properties of a ferroelectric memory cell with hysteresis plots 300-$a$ and 300-$b$, respectively, in accordance with various examples as disclosed herein. The hysteresis plots 300-$a$ and 300-$b$ may illustrate examples of a writing process and a reading process, respectively, for a memory cell 205 employing a ferroelectric capacitor 240 as described with reference to FIG. 2. The hysteresis plots 300-$a$ and 300-$b$ depict the charge, Q, stored on the ferroelectric capacitor 240 as a function of a voltage difference $V_{cap}$, between the terminals of the ferroelectric capacitor 240 (e.g., when charge is permitted to flow into or out of the ferroelectric capacitor 240 according to the voltage difference $V_{cap}$). For example, the voltage difference $V_{cap}$ may represent the difference in voltage between a digit line side of the capacitor 240 and a plate line side of the capacitor 240 (e.g., $V_{bottom} - V_{plate}$, $V_{DL} - V_{PL}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 240 described herein may include these or other ferroelectric materials. Electric polarization within a ferroelectric capacitor 240 results in a net charge at the surface of the ferroelectric material, and attracts opposite charge through the terminals of the ferroelectric capacitor 240. Thus, charge may be stored at the interface of the ferroelectric material and the capacitor terminals.

The hysteresis plots 300-$a$ and 300-$b$ may be understood from the perspective of a single terminal of a ferroelectric capacitor 240, and the voltages in the hysteresis plots 300-$a$ and 300-$b$ may represent a voltage difference across the capacitor (e.g., an electric potential between the terminals of the ferroelectric capacitor 240). For example, a positive voltage may be realized by applying a positive voltage to the perspective terminal (e.g., a cell bottom) and maintaining the reference terminal (e.g., a cell plate) at ground or virtual ground (or approximately zero volts (0V)). In some examples, a negative voltage may be applied by maintaining the perspective terminal at ground and applying a positive voltage to the reference terminal (e.g., cell plate). In other words, positive voltages may be applied to arrive at a negative voltage difference $V_{cap}$ across the ferroelectric capacitor 240 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-$a$ and 300-$b$.

As depicted in the hysteresis plot 300-$a$, a ferroelectric material used in a ferroelectric capacitor 240 may maintain a positive or negative polarization when there is no net voltage difference between the terminals of the ferroelectric capacitor 240. For example, the hysteresis plot 300-$a$ illustrates two possible polarization states, a charge state 305-$a$ and a charge state 310-$a$, which may represent a negatively saturated polarization state and a positively saturated polarization state, respectively. The charge states 305-$a$ and 310-$a$ may be at a physical condition illustrating remnant polarization (Pr) values, which may refer to the polarization (or charge) that remains upon removing an external bias (e.g., voltage). According to the example of the hysteresis plot 300-$a$, the charge state 305-$a$ may represent a logic 1 when no voltage difference is applied across the ferroelectric capacitor 240, and the charge state 310-$a$ may represent a logic 0 when no voltage difference is applied across the ferroelectric capacitor 240. In some examples, the logic values of the respective charge states or polarization states may be reversed or interpreted in an opposite manner to accommodate other schemes for operating a memory cell 205.

A logic 0 or 1 may be written to the memory cell by controlling the electric polarization of the ferroelectric material, and thus the charge on the capacitor terminals, by applying a net voltage difference across the ferroelectric capacitor 240. For example, the voltage 315 may be a voltage equal to or greater than a positive saturation voltage, and applying the voltage 315 across the ferroelectric capacitor 240 may result in charge accumulation until the charge state 305-$b$ is reached (e.g., writing a logic 1). Upon removing the voltage 315 from the ferroelectric capacitor 240 (e.g., applying a zero net voltage across the terminals of the ferroelectric capacitor 240), the charge state of the ferroelectric capacitor 240 may follow the path 320 shown between the charge state 305-$b$ and the charge state 305-$a$ at zero voltage across the capacitor. In other words, charge state 305-$a$ may represent a logic 1 state at an equalized voltage across a ferroelectric capacitor 240 that has been positively saturated.

Similarly, voltage 325 may be a voltage equal to or lesser than a negative saturation voltage, and applying the voltage 325 across the ferroelectric capacitor 240 may result in charge accumulation until the charge state 310-$b$ is reached (e.g., writing a logic 0). Upon removing the voltage 325 from the ferroelectric capacitor 240 (e.g., applying a zero net voltage across the terminals of the ferroelectric capacitor 240), the charge state of the ferroelectric capacitor 240 may follow the path 330 shown between the charge state 310-$b$ and the charge state 310-$a$ at zero voltage across the capacitor. In other words, charge state 310-$a$ may represent a logic 0 state at an equalized voltage across a ferroelectric capacitor 240 that has been negatively saturated. In some examples, the voltage 315 and the voltage 325, representing saturation voltages, may have the same magnitude, but opposite polarity across the ferroelectric capacitor 240.

To read, or sense, the stored state of a ferroelectric capacitor 240, a voltage may also be applied across the ferroelectric capacitor 240. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-*a*, or the charge state 310-*a*, or some other charge state was initially stored, among other factors.

The hysteresis plot 300-*b* illustrates an example for reading stored charge states 305-*a* and 310-*a*. A read voltage 335 may be applied, for example, as a voltage difference via a digit line 215 and a plate line 220 as described with reference to FIG. 2. The hysteresis plot 300-*b* may illustrate read operations where the read voltage 335 is positive voltage difference $V_{cap}$ (e.g., where $V_{bottom}-V_{plate}$ is positive, where $V_{DL}$ is greater than $V_{PL}$). A positive read voltage across the ferroelectric capacitor 240 may be referred to as a "plate low" read operation, where a digit line 215 is taken initially to a high voltage, and a plate line 220 is initially at a low voltage (e.g., a ground voltage). Although the read voltage 335 is shown as a positive voltage across the ferroelectric capacitor 240, in alternative access operations a read voltage may be a negative voltage across the ferroelectric capacitor 240, which may be referred to as a "plate high" read operation.

The read voltage 335 may be applied across the ferroelectric capacitor 240 while a memory cell 205 is selected (e.g., by activating a switching component 245 via a word line 210 as described with reference to FIG. 2). Upon applying the read voltage 335 to the ferroelectric capacitor 240, charge may flow into or out of the ferroelectric capacitor 240 via the associated digit line 215 and plate line 220, and, in some examples, different charge states or access line voltages may result depending on whether the ferroelectric capacitor 240 was at the charge state 305-*a* (e.g., storing a logic 1) or at the charge state 310-*a* (e.g., storing a logic 0), or some other charge state.

When performing a read operation on a ferroelectric capacitor 240 at the charge state 305-*a* (e.g., a logic 1), additional positive charge may accumulate across the ferroelectric capacitor 240, and the charge state may follow path 340 until reaching the charge and voltage of the charge state 305-*c*. The amount of charge flowing through the capacitor 240 may be related to the intrinsic or other capacitance of the digit line 215 or other access line. In a "plate low" read configuration, a read operation associated with the charge states 305-*a* and 305-*c*, or more generally a read operation associated with the logic 1 state, may be associated with a relatively small amount of charge transfer (e.g., compared to a read operation associated with the charge states 310-*a* and 310-*c*, or more generally the logic 0 state).

As shown by the transition between the charge state 305-*a* and the charge state 305-*c*, the resulting voltage 350 across the ferroelectric capacitor 240 may be a relatively large positive value due to the relatively large change in voltage at the capacitor 240 for the given change in charge. Thus, upon reading a logic 1 in a "plate low" read operation, the digit line voltage, equal to the sum of $V_{PL}$ and $V_{cap}$ (e.g., $V_{bottom}-V_{plate}$) at the charge state 310-*c*, may be a relatively high voltage. Such a read operation may not change the remnant polarization of the ferroelectric capacitor 240 that stored the charge state 305-*a*, and thus after performing the read operation the ferroelectric capacitor 240 may return to the charge state 305-*a* via path 340 when the read voltage 335 is removed (e.g., by applying a zero net voltage across the ferroelectric capacitor 240, by equalizing the voltage across the ferroelectric capacitor 240). Thus, performing a read operation with a positive read voltage on a ferroelectric capacitor 240 with a charge state 305-*a* may be considered a non-destructive read process.

When performing the read operation on the ferroelectric capacitor 240 at the charge state 310-*a* (e.g., a logic 0), the stored charge may reverse polarity as a net positive charge accumulates across the ferroelectric capacitor 240, and the charge state may follow the path 360 until reaching the charge and voltage of the charge state 310-*c*. The amount of charge flowing through the ferroelectric capacitor 240 may again be related to the intrinsic or other capacitance of the digit line 215 or other access line. In a "plate low" read configuration, a read operation associated with the charge states 310-*a* and 310-*c*, or more generally a read operation associated with the logic 0 state, may be associated with a relatively large amount of charge transfer (e.g., compared to a read operation associated with the charge states 305-*a* and 305-*c*, or more generally the logic 1 state).

As shown by the transition between the charge state 310-*a* and the charge state 310-*c*, the resulting voltage 355 may, in some cases, be a relatively small positive value due to the relatively small change in voltage at the capacitor 240 for the given change in charge. Thus, upon reading a logic 0 in a "plate low" read operation, the digit line voltage, equal to plate, the sum of $V_{PL}$ and $V_{cap}$ (e.g., $V_{bottom}-V_{plate}$) at the charge state 310-*c*, may be a relatively low voltage.

The transition from the charge state 310-*a* to the charge state 310-*d* may be illustrative of a sensing operation that is associated with a partial reduction or partial reversal in polarization or charge of a ferroelectric capacitor 240 of a memory cell 205 (e.g., a reduction in the magnitude of charge Q from the charge state 310-*a* to the charge state 310-*d*). In other words, according to the properties of the ferroelectric material, after performing the read operation the ferroelectric capacitor 240 may not return to the charge state 310-*a* when the read voltage 335 is removed (e.g., by applying a zero net voltage across the ferroelectric capacitor 240, by equalizing the voltage across the ferroelectric capacitor 240). Rather, when applying a zero net voltage across the ferroelectric capacitor 240 after a read operation of the charge state 310-*a* with read voltage 335, the charge state may follow path 365 from the charge state 310-*c* to the charge state 310-*d*, illustrating a net reduction in polarization magnitude (e.g., a less positively polarized charge state than initial charge state 310-*a*, illustrated by the difference in charge between the charge state 310-*a* and the charge state 310-*d*). Thus, performing a read operation with a positive read voltage on a ferroelectric capacitor 240 with a charge state 310-*a* may be described as a destructive read process. However, in some sensing schemes, a reduced remnant polarization may still be read as the same stored logic state as a saturated remnant polarization state (e.g., supporting detection of a logic 0 from both the charge state 310-*a* and the charge state 310-*d*), thereby providing a degree of non-volatility for a memory cell 205 with respect to read operations.

The position of the charge state 305-*c* and the charge state 310-*c* after initiating a read operation may depend on a number of factors, including the specific sensing scheme and circuitry. In some cases, the final charge may depend on the net capacitance of a digit line 215 coupled with the memory cell 205, which may include an intrinsic capacitance, an integrator capacitor, and others. For example, if a ferroelectric capacitor 240 is electrically coupled with a plate line 220 at 0V and the read voltage 335 is applied to a digit line 215, the voltage of the digit line 215 may fall when the memory cell 205 is selected due to charge flowing from the net capacitance of the digit line 215 to the ferroelectric capacitor 240. Thus, in some examples, a voltage measured at a sense component 250 may not be equal to the read voltage 335, or the resulting voltages 350 or 355, and instead may depend on the voltage of the digit line 215 or other access line following a period of charge sharing.

The position of the charge state 305-*c* and the charge state 310-*c* on hysteresis plot 300-*b* upon initiating a read operation may depend on the net capacitance of a digit line 215 or other access line, and may be determined through a load-line analysis. In other words, the charge states 305-*c* and 310-*c* may be defined with respect to the net capacitance of the digit line 215, or other access line (e.g., signal line). As a result, the voltage of the ferroelectric capacitor 240 after initiating a read operation (e.g., voltage 350 when reading the ferroelectric capacitor 240 that stored the charge state 305-*a*, voltage 355 when reading the ferroelectric capacitor 240 that stored the charge state 310-*a*), may be different and may depend on the initial state of the ferroelectric capacitor 240. In some examples, the amount of change in polarization of a ferroelectric capacitor 240 of a memory cell 205 as a result of a sensing operation may be selected according to a particular sensing scheme.

The initial state (e.g., charge state, logic state) of the ferroelectric capacitor 240 may be determined by comparing the voltage of a digit line 215 (or signal line, where applicable) resulting from the read operation with a reference voltage (e.g., via a reference line 255 as described with reference to FIG. 2). In some examples, the digit line voltage may be the sum of the plate line voltage and the final voltage across the ferroelectric capacitor 240 (e.g., voltage 350 when reading the ferroelectric capacitor 240 having a stored charge state 305-*a*, or voltage 355 when reading the ferroelectric capacitor 240 having a stored charge state 310-*a*). In some examples, the digit line voltage may be the difference between the read voltage 335 and the final voltage across the capacitor 240 (e.g., (read voltage 335–voltage 350) when reading the ferroelectric capacitor 240 having a stored charge state 305-*a*, (read voltage 335–voltage 355) when reading the ferroelectric capacitor 240 having a stored charge state 310-*a*).

In some examples, read operations of a memory cell 205 may be associated with a fixed voltage of a digit line 215, where a charge state of a ferroelectric capacitor 240 after initiating a read operation may be the same regardless of its initial charge state. For example, in a read operation where a digit line 215 is held at a fixed read voltage 335, the ferroelectric capacitor 240 may proceed to a charge state 370 for both the case where the ferroelectric capacitor initially stored a charge state 305-*a* and the case where the ferroelectric capacitor initially stored a charge state 310-*a*. Accordingly, rather than using a difference in voltage of a digit line 215 to detect an initial charge state or logic state, in some examples, the initial charge state or logic state of the ferroelectric capacitor 240 may be determined based at least in part on the difference in charge associated with the read operation. For example, as illustrated by hysteresis plot 300-*b*, a logic 1 may be detected based on difference in charge, Q, between charge state 305-*a* and charge state 370 (e.g., a relatively small amount of charge transfer), and a logic 0 may be detected based on a difference in charge, Q, between charge state 310-*a* and charge state 370 (e.g., a relatively large amount of charge transfer).

In some examples, such a detection may be supported by a charge-transfer sensing amplifier, a cascode (e.g., a transistor configured in a cascode arrangement), or other signal development circuitry between a digit line 215 and a signal line (e.g., of a sense component 250), where a voltage of the signal line may be based at least in part on the amount of charge transfer of a capacitor 240 after initiating a read operation (e.g., where the described charge transfer may correspond to an amount of charge that passes through the charge-transfer sensing amplifier, cascode, or other signal development circuitry). In such examples, the voltage of the signal line may be compared with a reference voltage (e.g., at a sense amplifier) to determine the logic state initially stored by the ferroelectric capacitor 240, despite the digit line 215 being held at a fixed voltage level.

In some examples where a digit line 215 is held at a fixed read voltage 335, a capacitor 240 may be positively saturated after a read operation irrespective of whether the capacitor 240 was initially at a charge state 305-*a* (e.g., a logic 1) or initially at a charge state 310-*a* (e.g., a logic 0). Accordingly, after such a read operation, the capacitor 240 may, at least temporarily, be charged according to a logic 1 state irrespective of its initial or intended logic state. Thus, a rewrite operation (e.g., a PRE operation) may be required at least when the capacitor 240 is intended to store a logic 0 state, where such a rewrite operation may include applying a write voltage 325 to store a logic 0 state as described with reference to hysteresis plot 300-*a*. Such rewrite operations may be configured or otherwise described as a selective rewrite operation, since a rewrite voltage may not need to be applied when the capacitor 240 is intended to store a logic 1 state. In some examples, such an access scheme may be referred to as a "2Pr" scheme, where the difference in charge for distinguishing a logic 0 from a logic 1 may be equal to two times the remnant polarization of a memory cell 205 (e.g., a difference in charge between charge state 305-*a*, a positively saturated charge state, and charge state 310-*a*, a negatively saturated charge state).

In some memory devices 110, charge leakage (e.g., charge leakage at or above a threshold) may adversely affect the ability of a memory device 110 to determine a logic state stored by a memory cell 205. For example, in the example context of a ferroelectric memory cell 205, for a read operation with a fixed read voltage 335 on a digit line 215 in accordance with hysteresis plot 300-*b*, when reading a memory cell 205 storing a logic 0, charge leakage may be superimposed on the difference in charge between charge state 310-*a* and charge state 370, and when reading a memory cell 205 storing a logic 1, charge leakage may be superimposed on the difference in charge between charge state 305-*a* and charge state 370. In some examples, the superimposed charge leakage may reduce margins for distinguishing a logic 0 from a logic 1 when reading a memory cell 205. For example, charge leakage of the memory cell 205, the digit line 215, or other access line (e.g., signal line) may increase the likelihood that a voltage of an access line is on the same side of a reference voltage when reading both a logic 1 and a logic 0. In other words, such charge leakage may increase the likelihood that a memory cell 205 that was written with a logic 1 is incorrectly read as storing a logic 0.

In accordance with the present disclosure, a memory device 110 may evaluate charge leakage associated with one or more memory cells 205 or access lines (e.g., digit lines 215, signal lines), and may determine whether to interpret the result of such an evaluation as a precursor to possible memory failures or other reduction in operational reliability. For example, a memory device 110 may support a diagnostic mode or operation that evaluates whether a charge leakage has a magnitude that, when superimposed on a read signal (e.g., associated with a difference in charge between charge state 305-*a* and charge state 370, associated with a difference in charge between charge state 310-*a* and charge state 370), may reduce or eliminate a read margin associated with distinguishing between logic states stored at a memory cell 205.

Figure 4:
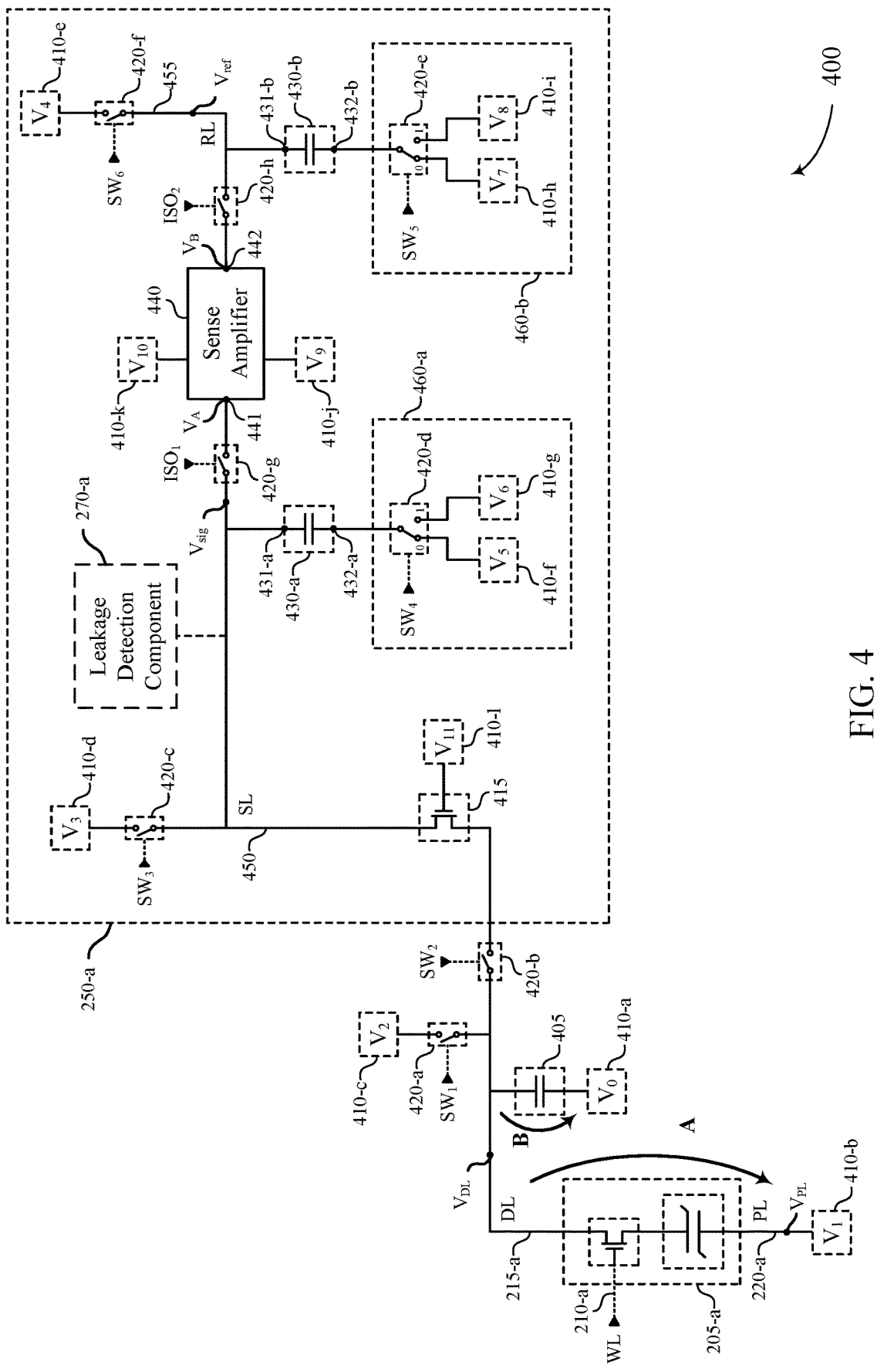
FIG. 4 illustrates an example of a circuit that supports charge leakage detection for memory system reliability in accordance with examples as disclosed herein.

FIG. 4 illustrates an example of a circuit 400 that supports charge leakage detection for memory system reliability in accordance with examples as disclosed herein. The circuit 400 illustrates an example of a memory cell 205-*a* configured to be selectively coupled with a sense component 250-*a*, which includes a sense amplifier 440 for sensing a logic state of the memory cell 205-*a*. Electrical charge or other signals may be communicated between the memory cell 205-*a* and the sense amplifier 440 and over a digit line 215-*a* and a signal line 450, which may, in combination, be referred to as a single access line between the memory cell 205-*a* and the sense amplifier 440. Signals of the access line may be illustrated by voltage $V_{DL}$ on the digit line 215-*a*, and $V_{sig}$ on the signal line 450, as shown.

The example circuit 400 may include an amplifier 415 coupled between the digit line 215-*a* and the signal line 450, which may be enabled by voltage source 410-*l*. The circuit 400 may also include a word line 210-*a* for selecting or deselecting the memory cell 205-*a* (e.g., by way of logic signal WL), and a reference line 455 for providing a reference signal (e.g., $V_{ref}$, as shown) for comparison with a signal of the signal line 450 when detecting a logic state of the memory cell 205-*a*. The circuit 400 may also include a plate line 220-*a* for accessing a cell plate of a capacitor of the memory cell 205-*a*. Thus, the memory cell 205-*a* may represent a memory cell coupled between a first access line (e.g., the digit line 215-*a* and the signal line 450) and a second access line (e.g., the plate line 220-*a*).

The circuit 400 may include various voltage sources 410, which may be coupled with various voltage supplies or common grounding or virtual grounding points of a memory device that includes the example circuit 400.

A voltage source 410-*a* may represent a common grounding point (e.g., a chassis ground, a neutral point), which may be associated with a common reference voltage having a voltage $V_0$, from which other voltages are defined. The voltage source 410-*a* may be coupled with the digit line 215-*a* via an intrinsic capacitance 405 (e.g., of or otherwise associated with the digit line 215-*a*). Although illustrated as a separate element in FIG. 4, the intrinsic capacitance 405 may be associated with properties distributed throughout the digit line 215-*a*. The intrinsic capacitance 405 may depend on physical characteristics of the digit line 215-*a*, including conductor dimensions (e.g., length, width, thickness) of the digit line 215-*a*. The intrinsic capacitance 405 may also depend on characteristics of adjacent access lines or circuit components, proximity to such adjacent access lines or circuit components, or insulation characteristics between the digit line 215-*a* and such access lines or circuit components. In other words, as charge flows along the digit line 215-*a*, some finite charge may be stored along the digit line 215-*a* (e.g., in the intrinsic capacitance 405).

A voltage source 410-*b* having a voltage $V_1$ may represent a plate line voltage source, and may be coupled with the memory cell 205-*a* via a plate line 220-*a* of the memory cell 205-*a*. In some examples, the voltage source 410-*b* may be controlled for access operations such as read or write operations, including those operations described with reference to hysteresis plots 300-*a* and 300-*b* of FIG. 3. In other words, in some examples, the voltage source 410-*b* may be a variable voltage source, where a voltage $V_1$ may have multiple levels.

A voltage source 410-*c* having a voltage $V_2$ may represent a digit line voltage source, and may be coupled with the digit line 215-*a* via a switching component 420-*a*, which may be activated or deactivated by a logical signal $SW_1$.

A voltage source 410-*d* having a voltage $V_3$ may represent a signal line precharge voltage source, and may be coupled with the signal line 450 via a switching component 420-*c*, which may be activated or deactivated by a logical signal $SW_3$.

A voltage source 410-*e* having a voltage $V_4$ may represent a reference signal voltage source, and may be coupled with the reference line 455 via a switching component 420-*f*, which may be activated or deactivated by a logical signal $SW_6$.

A voltage source 410-*l* having a voltage $V_{11}$ may represent an amplifier or cascode voltage source, and may be coupled with the amplifier 415. In some examples, the amplifier 415 may be a transistor, and the voltage source 410-*l* may be coupled with the gate of the transistor. The amplifier 415 may be coupled with the signal line 450 at a first terminal, and the digit line 215-*a* at a second terminal. The amplifier 415 may provide a conversion of charge, voltage, or other signals between the digit line 215-*a* and the signal line 450.

The amplifier 415 may permit a flow of charge (e.g., electrical charge, electrical current) from the signal line 450 to the digit line 215-*a*, as fed or enabled by the voltage source 410-*l*, upon a reduction in voltage of the digit line 215-*a* (e.g., upon selection of the memory cell 205-*a*). In some examples, the described flow of charge across the amplifier 415 may correspond to a charge transfer associated with logic states of the memory cell 205-*a*, or a charge transfer otherwise associated with accessing the memory cell 205-*a*. For example, when the memory cell 205-*a* includes a ferroelectric capacitor 240 as illustrated by the hysteresis plots 300-*a* and 300-*b*, and the amplifier 415 is configured to maintain the voltage of the digit line 215-*a* to a read voltage 335, a flow of charge across the amplifier 415 (e.g., during a read operation) may correspond to or be otherwise based at least in part on the difference in charge, Q, between charge states 370 and 305-*a* when the memory cell 205-*a* stored a logic 1, and a flow of charge across the amplifier 415 may correspond to or otherwise be based at least in part on the difference in charge, Q, between charge states 370 and 310-*a* when the memory cell 205-*a* stored a logic 0.

The circuit 400 may also include a first integrator capacitor 430-*a* and a second integrator capacitor 430-*b*, which may each be coupled with a respective variable voltage source 460. For example, the first integrator capacitor 430-*a* may be coupled with the signal line 450 at a first terminal 431-*a*, and coupled with a variable voltage source 460-*a* at a second terminal 432-*a*. The second integrator capacitor 430-*b* may be coupled with the reference line 455 at a first terminal 431-*b*, and coupled with a variable voltage source 460-*b* at a second terminal 432-*b*.

In some examples, a flow of charge across the amplifier 415 may be accompanied by a change in voltage of the signal line 450. For example, when the signal line 450 is not otherwise coupled with a voltage source, a relatively small flow of charge to the digit line 215-*a* (e.g., a difference in charge between charge state 305-*a* and charge state 370 described with reference to FIG. 3B) may be associated with a relatively small change in voltage of the signal line 450, whereas a relatively large flow of charge to the digit line 215-*a* (e.g., a difference in charge between charge state 310-*a* and charge state 370 described with reference to FIG. 3B) may be associated with a relatively large change in voltage of the signal line 450. Changes in voltage of the signal line 450 associated with an access operation may be based on the net capacitance of the signal line 450 (e.g., including the integrator capacitor 430-*a*), where the signal line 450 may undergo a relatively small change in voltage or a relatively large change in voltage depending on the flow of charge across the amplifier 415 after selecting the memory cell 205-*a*.

In various examples, the amplifier 415 may be referred to as a "voltage regulator" or a "bias component," relating to how the amplifier 415 regulates a flow of charge in response to the voltage or charge transfer of the digit line 215-*a*. In some examples, the amplifier 415, or combination of the amplifier 415 and the integrator capacitor 430-*a*, may be referred to as a charge transfer sensing amplifier. The amplifier 415 may be isolated from the digit line 215-*a* by a switching component 420-*b*, which may be activated or deactivated by a logical signal $SW_2$. In some examples, the switching component 420-*b* may be part of a column decoder 230, a multiplexer, or some other circuitry configured to selectively couple the digit line 215-*a* with the amplifier 415 or the signal line 450.

In the example of circuit 400, the variable voltage source 460-*a* may include a voltage source 410-*f* having a voltage $V_5$ and a voltage source 410-*g* having a voltage $V_6$, which may be selected for connection with the first integrator capacitor 430-*a* by a switching component 420-*d* by way of a logical signal $SW_4$. In some examples, the voltage source 410-*f* may be coupled with a common grounding point (not shown). In other examples the voltage source 410-*f* may be coupled with a voltage supply that provides a positive or negative voltage. Voltage source 410-*g* may be coupled with a voltage supply having a higher voltage than that of voltage source 410-*f*, which may provide a voltage boosting function in accordance with the difference in voltage between voltage source 410-*g* and 410-*f*, equal to $V_6-V_5$, or simply $V_6$ when the voltage source 410-*f* is grounded.

In the example of circuit 400, the variable voltage source 460-*b* may include a voltage source 410-*h* having a voltage $V_7$ and a voltage source 410-*i* having a voltage $V_8$, which may be selected for connection with the second integrator capacitor 430-*b* by a switching component 420-*e* by way of a logical signal $SW_5$. In some examples, the voltage source 410-*h* may be coupled with a common grounding point (not shown). In other examples the voltage source 410-*h* may be coupled with a voltage supply that provides a positive or negative voltage. Voltage source 410-*i* may be coupled with a voltage supply having a higher voltage than that of voltage source 410-*h*, which may provide a voltage boosting function in accordance with the difference in voltage between voltage source 410-*i* and 410-*h*, equal to $V_8-V_7$, or simply $V_8$ when the voltage source 410-*h* is grounded.

Although circuit 400 is shown as including two variable voltage sources 460, some configurations in accordance with the present disclosure may include a single, common variable voltage source 460. For example, a first voltage source 410 of a common variable voltage source 460 may be coupled with both the second terminal 432-*a* of the first integrator capacitor 430-*a* and the second terminal 432-*b* of the second integrator capacitor 430-*b* when a switching component 420 of the common variable voltage source 460 is deactivated, and a second voltage source 410 of the common variable voltage source 460 may be coupled with both the second terminal 432-*a* of the first integrator capacitor 430-*a* and the second terminal 432-*b* of the second integrator capacitor 430-*b* when the switching component 420 of the common variable voltage source 460 is activated. In some examples that use a common variable voltage source 460, the source voltage provided to the second terminal 432-*a* of the first integrator capacitor 430-*a* may be different to the source voltage provided to the second terminal 432-*b* of the second integrator capacitor 430-*b* due to differences in the circuit (e.g., conductor length, width, resistance, capacitance) between the variable voltage source 460 and each of the integrator capacitors 430.

Further, although the variable voltage sources 460 are illustrated as including two voltage sources 410 and a switching component 420, a variable voltage source 460 supporting the operations herein may include other configurations, such as a voltage buffer that provides a variable voltage to one or both of the second terminal 432-*a* of the first integrator capacitor 430-*a* and the second terminal 432-*b* of the second integrator capacitor 430-*b*. In other examples, a variable voltage source 460 may be replaced with fixed voltage sources, or other types of voltage sources. Additionally, or alternatively, the described operations of voltage boosting may be omitted from an access operation.

In some examples, the sense amplifier 440 may be selectively coupled with or isolated from portions of the circuit 400. For example, the sense amplifier 440 may be coupled with the signal line 450 via a switching component 420-*g* (e.g., an isolation component), which may be activated or deactivated by a logical signal $ISO_1$. Additionally, or alternatively, the sense amplifier 440 may be coupled with the reference line 455 via a switching component 420-*h* (e.g., an isolation component), which may be activated or deactivated by a logical signal $ISO_2$. Further, the sense amplifier 440 may be coupled with a voltage source 410-*j* having a voltage $V_9$ and a voltage source 410-*k* having a voltage of $V_{10}$, which, in some examples may correspond to low and high voltage levels, respectively, for information signaling over a channel 115 (e.g., via an input/output component 260).

Each of the logical signals illustrated in circuit 400 may be provided by a memory controller (not shown), such as a local memory controller 165 described with reference to FIG. 1, or a local memory controller 265 described with reference to FIG. 2. In some examples, certain logical signals may be provided by other components. For example, logical signal WL may be provided by a row decoder 225 as described with reference to FIG. 2.

In various examples, voltage sources 410 may be coupled with different configurations of voltage supplies or common grounding or virtual grounding points of a memory device that includes the example circuit 400. In some examples, voltage sources 410-*a*, 410-*f*, 410-*h*, or 410-*j*, or any combination thereof, may be coupled with the same ground point or virtual ground point, and may provide substantially the same reference voltage for various operations of accessing the memory cell 205-*a*. In some examples, several voltage sources 410 may be coupled with the same voltage supply of a memory device. For example, voltage sources 410-*c*, 410-*d*, 410-*g*, 410-*i*, or 410-*k*, or any combination thereof, may be coupled with a voltage supply having a certain voltage (e.g., a voltage of 1.5V, which may be referred to as "VARY"). In such embodiments, the signal line 450 may be boosted to a voltage substantially equal to 2*VARY, or approximately 3.0V, prior to selecting the memory cell 205-*a* via word line 210-*a* for sensing. In other examples, voltage sources 410-*g* and 410-*i* may be coupled with a different voltage supply than other voltage supplies (e.g., a voltage of 1.2V, which may be referred to as "PDS"), which may thus be associated with a voltage boost of 1.2V.

In some examples, the voltage sources 410-*j* and 410-*k* may be selected according to particular input/output parameters. For example, voltage sources 410-*j* and 410-*k* may be substantially at 0V and 1V, respectively, in accordance with certain input/output component conventions such as some DRAM conventions. Although voltage sources 410 may be coupled with common voltage supplies or grounding points, the voltage of each of the voltage sources 410 coupled with a common voltage supply or common grounding point may be different due to various differences in the circuit (e.g., conductor length, width, resistance, capacitance) between the respective voltage sources 410 and the associated common voltage supply or common grounding point.

Voltage source 410-e may provide a reference voltage for sensing the logic state of the memory cell 205-a. For example, a voltage of $V_4$ may be configured to be an average between signal line voltages associated with sensing a logic 1 and a logic 0. In some examples, a voltage of $V_4$ may be provided as a voltage dropped from a voltage supply of the memory device, which may be the same voltage supply coupled with other voltage sources 410. For example, $V_4$ may be provided by connecting voltage source 410-e with a same voltage supply as voltage source 410-d, but with an intervening electrical load (e.g., a resistive load or capacitance) between the voltage supply and the voltage source 410-e).

The circuit 400 may also include a leakage detection component 270-a, which may be an example of the leakage detection component 270 described with reference to FIG. 2. The leakage detection component 270-a may be configured to detect charge leakage associated with one or more of the memory cell 205-a, the digit line 215-a, the amplifier 415, or the signal line 450. For example, the leakage detection component 270-a may be configured to monitor a voltage of the signal line 450 (e.g., $V_{sig}$), and evaluate for charge leakage by monitoring for a change in voltage of the signal line 450, or by comparing a voltage of the signal line 450 to a reference voltage or threshold (e.g., using a sense amplifier, a multi-level cell (MLC) latch, a comparator). For example, the leakage detection component 270-a may be configured to identify a drop in voltage of the signal line 450 (e.g., a voltage at or below a threshold or reference voltage) during conditions where the voltage of the signal line 450 should be, or is otherwise expected to be stable or above a threshold (e.g., after a signal on the digit line 215-a or signal line 450 has been developed or should otherwise be stable). In some examples, identifying such a drop in voltage may indicate that charge is flowing across the amplifier 415 (e.g., as enabled by the voltage source 410-l) or out of the integrator capacitor 430-a, which may be responsive to the voltage of the digit line 215-a falling due to charge leakage (e.g., along leakage paths "A" or "B" or some other path).

Although the leakage detection component 270-a is illustrated as a separate component of the circuit 400, in some examples, a leakage detection component 270 or associated functionality may be incorporated into or coupled with a different part of the circuit 400. In one example, the sense amplifier 440 may be configured to perform aspects of the described charge leakage evaluations, including a monitoring of the signal line 450 for evidence of charge leakage. In some examples, the sense amplifier 440 may be configured to evaluate for charge leakage by comparing a voltage of the signal line 450 to a reference voltage, which may or may not be the same as a reference voltage used for detecting a logic state from the memory cell 205-a. For example, the sense amplifier 440 may be configured for a first reference voltage for detecting a logic state of the memory cell 205-a (e.g., via reference line 455), and a second reference voltage for evaluating for charge leakage of the signal line 450, digit line 215-a, or memory cell 205-a (e.g., via the reference line 455 or some other reference line or reference voltage source, not shown). In another example, a leakage detection component 270 may be coupled with a digit line 215 to support monitoring of the digit line 215 for charge leakage.

In some access schemes, the integrator capacitor 430-a may be charged to a voltage to support a read operation of the memory cell 205-a (e.g., a 2Pr read operation, a read operation where the amplifier 415 supports a biasing of the memory cell 205-a with a read voltage 335). In such schemes, the integrator capacitor 430-a may be discharged into the signal line 450 to support charge transfer with the memory cell 205-a, with a magnitude of discharge being dependent on the logic state or charge state stored by the memory cell 205-a. Such a discharge may be associated with a displacement component of charge transfer with the memory cell 205-a, and because the displacement component may depend on a charge state of the memory cell 205-a, such a charging and discharging of the integrator capacitor 430-a associated with some read operations may not be suitable for some types of charge leakage evaluation.

Charge leakage evaluations in accordance with examples as disclosed herein may include various operations directed to eliminating or reducing a displacement component of accessing a memory cell 205 (e.g., a charge component associated with or evaluated when detecting a logic state stored by the memory cell 205 as part of a normal read operation), or other behavior of a memory cell 205 that may impart a variance or uncertainty in a charge leakage evaluation. In other words, a charge leakage evaluation may include or follow various operations used to establish a baseline or diagnostic condition (e.g., of the memory cell 205-a, of the integrator capacitor 430-a, of the signal line 450, of the digit line 215-a) from which a leakage evaluation may be based. Various examples of such techniques may include or refer to a baseline or diagnostic logic state, a baseline or diagnostic charge state, a baseline or diagnostic material state (e.g., of a memory cell 205 including a material memory element), a baseline or diagnostic voltage state, or other conditions that support reducing, minimizing, or eliminating sources of variation that may limit the accuracy or effectiveness of a charge leakage evaluation.

In some examples, as part of a charge leakage evaluation, the memory cell 205-a may be charged or polarized to a diagnostic state that is common to (e.g., the same for) the memory cell 205-a regardless of its prior condition (e.g., previously written logic state, stored logic state, stored charge state). For example, a charge leakage evaluation may include writing the memory cell 205-a to a particular logic state or charge state, such as biasing the memory cell 205-a according to a write voltage (e.g., voltage 315, voltage 325), or biasing the memory cell 205-a according to a read voltage that charges or polarizes the memory cell 205-a with a particular logic state (e.g., voltage 350 in constant voltage read operation, a charge state 370). In some examples, such a biasing may cause at least some level of discharge of the integrator capacitor 430-a, and the integrator capacitor 430-a may be thus be recharged or charged according to another voltage level, so that subsequent reductions in voltage (e.g., of the signal line 450), or associated reduction of charge in the integrator capacitor 430-a, can be attributed or assigned to a charge leakage phenomenon (e.g., independent of displacement variability of the memory cell 205-a). In some examples, such techniques may support the use of a common reference condition for evaluating charge leakage (e.g., a common reference voltage), where the common reference condition is valid or applicable regardless of the state of the memory cell 205-a prior to the charge leakage evaluation operations.

In some examples, charge leakage evaluation techniques may be described in the context of modifications to other access operations that may be supported by the circuit 400. For example, a leakage evaluation may be similar to operations that may occur in response to an ACT command or other operational sequence of the circuit 400, but with the sense amplifier 440 powered off, deactivated, decoupled (e.g., from the signal line, from the reference line 455), or otherwise idle or not used for supporting a determination of a logic state of the memory cell 205-a. However, in some cases, such operations may also include a detection of a logic state of the memory cell 205-a (e.g., with a leakage detection evaluation following a charge exchange associated with a read operation). In some examples, such modified ACT operations may be associated with a displacement charge integration or cancellation, such that the memory cell 205-a is charged or polarized at a reference or diagnostic level that is independent of the previous state of the memory cell 205-a. These operations may be followed by a recharge of the integrator capacitor 430-a, or may be otherwise associated with a maintaining of a charge at the integrator capacitor 430-a (e.g., a charge associated with a logic state previously stored by the memory cell 205-a may be integrated by the integrator capacitor 430-a, and the integrator capacitor 430-a may be discharged or recharged to negate that first integration and to support a subsequent integration related to leakage detection, in some cases with the word line 210-a remaining activated throughout both the first and second integrations, and additionally or alternatively while the sense amplifier 440 remains deactivated).

Thus, following a modified ACT operation, the evaluation may include a leakage charge or leakage current integration, which may be supported by or determined from one or more of a charge transfer from the integrator capacitor 430-a, a voltage change (e.g., drop) of the signal line 450, a charge transfer across the amplifier 415 (e.g., as regulated by the voltage source 410-l), or a voltage change (e.g., drop) of the digit line 215-a. In some examples, the evaluation may be associated with a comparison (e.g., voltage comparison, charge comparison, comparison to a threshold, comparison to a reference condition) at the leakage detection component 270-a, the sense amplifier 440, or some otherwise positioned leakage detection component 270-a, which may include a latching or sense amplifier firing. Information related to the comparison may be written as an indication of a fault, or normal operation, or directly forwarded (e.g., to a local memory controller 165, to a local memory controller 265, to a device memory controller 155, to a host device 105). Following these operations, information may or may not be stored at the memory cell 205-a, which may include one or more operations associated with a PRE command or operational sequence (e.g., a PRE sequence common to other accessing of the memory cell 205-a, a modified PRE sequence specific to leakage evaluation operations.

Figure 5:
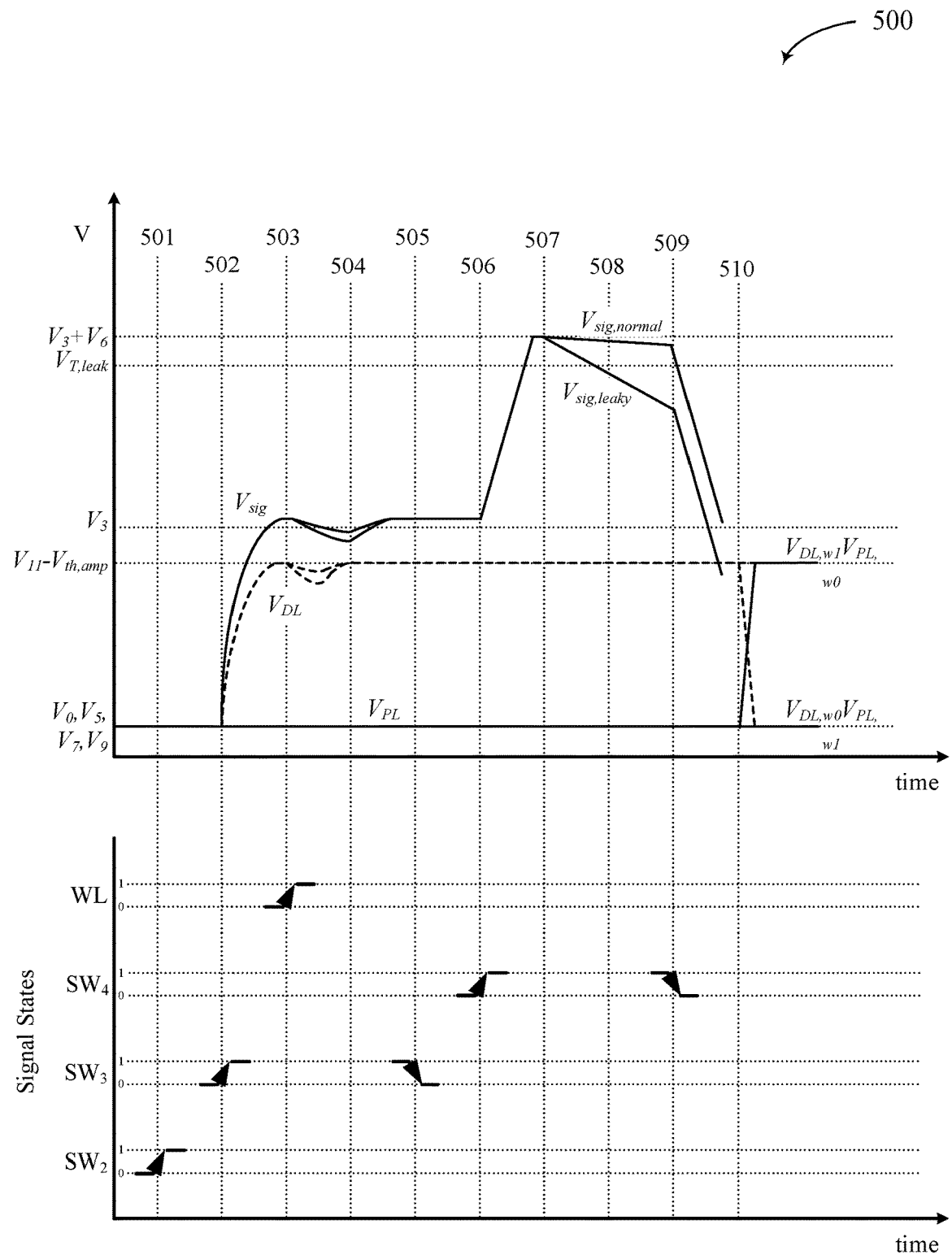
FIG. 5 shows a timing diagram illustrating operations of an example access procedure that supports charge leakage detection for memory system reliability in accordance with examples as disclosed herein.

FIG. 5 shows a timing diagram 500 illustrating operations of an example access procedure that supports charge leakage detection for memory system reliability in accordance with examples as disclosed herein. The example access procedure is described with reference to components of the example circuit 400 described with reference to FIG. 4. In some examples, one or more operations of timing diagram 500 may be common with those used in other ACT or PRE sequences of the circuit 400. In some examples, one or more operations of the timing diagram 500 may be modified in comparison to other ACT or PRE sequences of the circuit 400 (e.g., using voltage levels or sources that are greater than or less than those in other ACT or PRE sequences, using longer or shorter timing than other ACT or PRE sequences, adding or omitting operations relative to other ACT or PRE sequences).

In the example of timing diagram 500, voltage sources 410-a, 410-f, 410-h, and 410-j are considered to be grounded, and therefore at a zero voltage (e.g., $V_0$=0V, $V_5$=0V $V_7$=0V, and $V_9$=0V). However, in other examples voltage sources 410-a, 410-f, and 410-h may be at non-zero voltages, and the voltages of timing diagram 500 may thus be adjusted accordingly. In some examples, prior to initiating the operations of timing diagram 500, the digit line 215-a and the plate line 220-a may be controlled to the same voltage, which may minimize charge leakage across the memory cell 205-a. For example, according to the timing diagram 500, the digit line 215-a has an initial voltage of 0V, which may be the same as the initial voltage of the plate line 220-a. In other examples, the digit line 215-a and the plate line 220-a may have some other initial voltage different from the ground voltage.

At 501, the access procedure may include activating switching component 420-b (e.g., by activating logical signal $SW_2$). Activating switching component 420-b may connect the digit line 215-a with the sense component 250-a. In some examples, the operations of 501 may be referred to as a column selection operation (e.g., selecting a column of memory cells 205 via a column multiplexer that includes the switching component 420-b).

At 502, the access procedure may include activating switching component 420-c (e.g., by activating logical signal $SW_3$). Activating switching component 420-c may connect voltage source 410-d with the signal line 450, and accordingly the voltage of signal line 450 may rise to voltage level $V_3$ as charge flows into the integrator capacitor 430-a. Thus, activating switching component 420-c may initiate a charging or precharging operation for the integrator capacitor 430-a. For example, at 502, the switching component 420-d may be deactivated, such that the voltage source 410-f (e.g., a ground or virtual ground voltage at 0V) is coupled with the second terminal 432-a of the integrator capacitor 430-a, and the voltage source 410-d is coupled with the first terminal 431-a of the integrator capacitor 430-a. Thus, the integrator capacitor 430-a may be charged according to the voltage difference between the voltage source 410-d and the voltage source 410-f. In some examples of a charge leakage evaluation, the charging of integrator capacitor 430-a may be an example of charging a capacitor coupled with access line associated with the charge leakage evaluation.

The operations of 502 may also initiate a charging or precharging operation for the digit line 215-a. For example, as fed by the voltage source 410-d, charge may flow through the amplifier 415 and build on the digit line 215-a, causing the voltage on the digit line 215-a to rise. The voltage of the digit line 215-a may rise until the threshold voltage of the amplifier 415 (e.g., threshold voltage $V_{th,amp}$) is no longer exceeded. Thus, after activating switching component 420-c, the voltage of the digit line 215-a may rise to a voltage level of $V_{11}$-$V_{th,amp}$ as charge flows from the signal line (e.g., as fed by the voltage source 410-d), and the digit line 215-a, including intrinsic capacitance 405, may be charged according to the voltage difference between the voltage level $V_{11}$-$V_{th,amp}$ and the voltage source 410-a (e.g., 0V). In some examples of a charge leakage evaluation, the charging of intrinsic capacitance 405 may be an example of charging a capacitor coupled with access line associated with the charge leakage evaluation In some examples, the voltage level $V_{11}$ may be selected such that the digit line 215-a is charged to substantially the same level as the signal line 450. For example, the voltage level $V_{11}$ may be set at a level of $V_3+V_{th,amp}$, which may be provided by a voltage supply having a voltage level greater than voltage source 410-d. Thus, in some examples, the digit line 215-a may rise to a voltage level equal to or nearly equal to voltage level $V_3$ in response to activating switching component 420-c at 502. In some examples, the voltage between the digit line 215-a and the plate line 220-a after the operations of 502 may correspond to the read voltage 335 described with reference to FIG. 3B.

Additionally, or alternatively, in some examples, the digit line 215-a may be charged or precharged by the voltage source 410-c. For example, prior to activating switching component 420-b, or prior to activating switching component 420-c, a leakage evaluation in accordance with the described techniques may include activating switching component 420-a (e.g., by activating logical signal $SW_1$). Activating switching component 420-a may initiate an alternative charging or precharging operation for the digit line 215-a that is not shown in timing diagram 500. As fed by the voltage source 410-c, charge may build on the digit line 215-a, causing the voltage on the digit line 215-a to match the voltage level $V_2$. In some examples, the voltage level $V_2$ may be substantially equal to the voltage level $V_3$, such that the digit line 215-a and the signal line 450 are charged to the same voltage prior to activating switching component 420-b. In some examples, precharging the digit line 215-a with the voltage source 410-c may reduce power consumption or reduce precharge time associated with accessing the memory cell 205-a or other operations of the timing diagram 500. In some examples, the voltage difference between $V_2$ and $V_1$ after activating switching component 420-a may correspond to the read voltage 335 described with reference to FIG. 3B. In some examples, following a precharge of the digit line 215-a by the voltage source 410-c, the access procedure may include activating switching component 420-b (e.g., by activating logical signal $SW_2$) to connect the digit line 215-a with the sense component 250-a.

At 503, the access procedure may include selecting the memory cell 205-a (e.g., by activating a word line via logical signal WL). Selecting the memory cell 205-a may cause a capacitor of the memory cell 205-a to be coupled with the digit line 215-a. In some examples, the operations of 503 may be referred to as opening a page or row of memory cells 205 of a memory array 170 (e.g., that includes the memory cell 205-a), and thus the operations of 503 may be applicable to one or more columns of memory cells 205 (e.g., one or more digit lines 215). For example, opening a page or row of memory cells 205 may include coupling all of the memory cells 205 of a row with a respective digit line 215, or some subset of the memory cells 205 of the row with a respective digit line 215 (e.g., according to a column multiplexing scheme associated with activating one or more column selection components, such as the activation of switching component 420-b of 501).

In some examples, a voltage across the memory cell 205-a when selecting the memory cell 205-a at 503 (e.g., $V_{DL}-V_{PL}$) may be equal to the read voltage 335 described with reference to FIG. 3B. Charge may be shared between the memory cell 205-a, the digit line 215-a, and the signal line 450, which may depend on the logic state (e.g., charge state, polarization state) stored in the memory cell 205-a.

For example, when the memory cell 205-a stores a logic 1, the capacitor of the memory cell 205-a may store a positive charge (e.g., a charge state 305-a as described with reference to FIG. 3). Thus, when memory cell 205-a storing a logic 1 is selected, a relatively small amount of charge may flow from the digit line 215-a to the memory cell 205-a. As charge flows from the digit line 215-a to the memory cell 205-a, the voltage of the digit line 215-a may drop (e.g., a relatively small drop), which may allow the threshold voltage of the amplifier 415 to be exceeded. When the threshold voltage of the amplifier 415 is exceeded, charge may flow from the signal line 450 (e.g., from the integrator capacitor 430-a, from the voltage source 410-d) to the digit line 215-a across the amplifier 415, as well as some amount of charge from the voltage source 410-l, depending on the characteristics of the amplifier 415. Charge may flow to the digit line 215-a until the voltage of the digit line 215-a returns to the voltage level equal to $V_{11}-V_{th,amp}$.

Alternatively, when the memory cell 205-a stores a logic 0, the capacitor of the memory cell 205-a may store a negative charge (e.g., charge state 310-a as described with reference to FIG. 3). Thus, when memory cell 205-a storing a logic 0 is selected, a relatively large amount of charge may flow from the digit line 215-a to the memory cell 205-a, which may be associated with a relatively large drop in digit line voltage. Accordingly, the signal line 450 may undergo a relatively larger voltage drop as charge flows through the amplifier 415 to return the digit line 215-a to the voltage level $V_{11}-V_{th,amp}$, such that the threshold voltage $V_{th,amp}$ of the amplifier 415 is no longer exceeded. In examples where a 2Pr sensing operation is employed, selecting the memory cell 205-a storing a logic 0 may result in a reversal of saturation polarization of the capacitor of the memory cell 205-a, such that an amount of charge associated with at least twice the saturation polarization flows into the memory cell 205-a.

The operations of 503 may be an example of writing a diagnostic state or charge state to the memory cell 205-a, or otherwise establishing a baseline or diagnostic condition to the memory cell 205-a, or the digit line 215-a. For example, as a result of the bias applied to the memory cell 205-a (e.g., a read voltage 335), the memory cell 205-a may be charged or polarized to a charge state 370, regardless of the state of the memory cell 205-a prior to the operations of 503. In some examples, such a condition may correspond to writing the memory cell 205-a with a logic 1 (e.g., with or without equalizing a bias across the memory cell 205-a). Thus, the operations of 503, or the operations of 501 through 503, may be an example of zeroing a state or signal associated with the digit line 215-a. However, in various examples, the state or signals of the signal line 450 may or may not be zeroed or equalized after the operations of 503. For example, to support the different charge transfers associated with charging or polarizing the memory cell 205-a, the integrator capacitor 430-a may have discharged by different amounts, which may be associated with different voltage levels of the signal line 450.

At 504, the access procedure may include various examples of recharging the capacitor integrator, or otherwise zeroing or equalizing signals associated with the signal line 450 (e.g., establishing a baseline or diagnostic condition of the signal line 450 or integrator capacitor 430-a). In some examples (e.g., as illustrated), switching component 420-c may remain activated during the operations of 503, and thus, as part of the operations of 504, the integrator capacitor 430-a may be charged or recharged by the voltage source 410-d (e.g., according to a voltage difference of $V_3-V_5$). In other examples, the switching component 420-c may be deactivated prior to the operations of 503 (e.g., floating the signal line 450), which may or may not be accompanied by activating the switching component 420-d (e.g., to provide a voltage boost functionality). Thus, in some examples, at 504, the switching component 420-c may be reactivated at 504 (e.g., by activating logical signal $SW_3$, by deactivating the logical signal $SW_4$ if it had been activated) to support the recharging of the integrator capacitor 430-a, or charging the integrator capacitor 430-a according to an otherwise common level (e.g., according to a voltage difference of $V_3$–$V_5$).

At 505, the access procedure may include deactivating the switching component 420-c (e.g., by deactivating logical signal $SW_3$). Deactivating switching component 420-c may isolate voltage source 410-d from the signal line 450, and the voltage of signal line 450 may, in some examples, hold at voltage level $V_3$. The deactivation of switching component 420-c may be an example of removing a bias from an access line (e.g., signal line 450) associated with a charge leakage evaluation. Upon deactivating the switching component 420-c the signal line 450, and thus the first terminal 431-a of the integrator capacitor 430-a, may be floating, and the signal line 450 may, in some examples, maintain a level of charge according to the capacitance of the signal line 450, including the capacitance of the integrator capacitor 430-a. The operations of 505 may also be an example of electrically floating an access line (e.g., signal line 450) associated with the charge leakage evaluation.

At 506, the access procedure may include activating switching component 420-d (e.g., by activating logical signal $SW_4$). Activating switching component 420-d may cause a transition from the voltage source 410-f being coupled with the second terminal 432-a of the integrator capacitor 430-a to the voltage source 410-g being coupled with the second terminal 432-a of the integrator capacitor 430-a. By connecting the second terminal 432-a of the integrator capacitor 430-a to a voltage source at a higher voltage, the charge stored by the integrator capacitor 430-a may be boosted to a higher voltage, and accordingly the voltage of signal line 450, coupled with the first terminal 431-a of the integrator capacitor 430-a, may rise to voltage level $V_3+V_6$. Thus, activating switching component 420-d may initiate a boosting operation for the integrator capacitor 430-a, which may support a charge leakage comparison associated with the voltage level of $V_3+V_6$.

In some examples, the voltage level of $V_3+V_6$ may be equal to a voltage used when accessing the memory cell 205-a for a read operation (e.g., to evaluate a logic state stored by the memory cell 205-a). In other examples, the voltage level of $V_3+V_6$ may be different than (e.g., less than) a voltage used when accessing the memory cell 205-a for a read operation. In some examples, the operations of 506 may be omitted, such that a charge leakage comparison is based on a signal line voltage, and corresponding charge state of the integrator capacitor 430-b, of $V_3$, rather than the illustrated voltage, and corresponding charge state of the integrator capacitor 430-b, of $V_3+V_6$.

In some examples, charge may leak from one portion of the circuit 400 to another during the operations of the timing diagram 500. In one example, charge leakage may follow a path "A" from the digit line 215-a to the plate line 220-a, which may illustrate a charge leakage through the memory cell 205-a (e.g., across a dielectric portion of a capacitor 240 of the memory cell 205-a, around a dielectric portion of the capacitor). In another example, leakage may follow a path "B" from the digit line 215-a to the voltage source 410-a, which may illustrate a charge leakage from the digit line 215-a to a ground voltage source or reference voltage or component (e.g., a chassis leakage). Other examples, not illustrated, may include other leakage paths that permit any other charge transfer between the digit line 215-a and another component of the circuit 400, or the signal line 450 and another component of the circuit 400.

In some examples, charge leakage in the circuit 400 may be driven by a difference in voltage between the digit line 215-a and the plate line 220-a, and may be relatively high when a switching component 245 is activated (e.g., for cell-specific charge leakage associated with the memory cell 205-a). Thus, charge leakage may be relatively high after 506, when the word line 210-a is activated and the difference between $V_{DL}$ and $V_{PL}$ is relatively large (e.g., when the signal line 450 is boosted according to the activation of logical signal $SW_4$, which may be an example of an advantageous voltage boost to improve the fidelity of a charge leakage evaluation). However, charge leakage may be sufficient for charge leakage evaluation without the voltage boosting associated with the operations of 506 (e.g., when the operations of 506 are omitted).

At 507, the access operation may begin a leakage charge integration period, over which charge leakage may affect the voltage of one or both of the signal line 450 or the digit line 215-a. In one example, charge leakage via paths A or B may cause charge stored along the digit line 215-a to drop, and, as controlled by the voltage source 410-l, charge may be transferred from the signal line 450 to the digit line 215-a via the amplifier 415. Thus, charge leakage may be associated with a drop in voltage of the signal line 450, which may be enabled by these and other techniques for leakage charge integration. In some examples of the circuit 400, some amount of charge leakage may be normal, or otherwise accounted for, over a leakage charge integration period, and a corresponding expected voltage may be illustrated by the relatively small drop of voltage $V_{sig,normal}$. However, abnormal charge leakage may be associated with a relatively larger voltage drop over a leakage charge integration interval, which may be illustrated by the voltage $V_{sig,leaky}$.

Although illustrated as a particular operation of the timing diagram 500, charge leakage may be occurring over additional portions of the timing diagram, and a leakage charge integration period may accordingly begin at another portion of the timing diagram 500 (e.g., upon the removal of an access line bias, upon floating an access line, after the operations of 505). Moreover, although the leakage charge integration period is associated with the logical signal WL being activated (e.g., the switching component 245 being open), in some examples, the logical signal WL may be deactivated, which may support an evaluation of leakage through the switching component 245 when it is intended to be closed.

At 508, the access operation may include evaluating an electrical characteristic to determine a leakage condition of the circuit 400. For example, the leakage detection component 270-a, or the sense amplifier 440, may be configured to monitor the voltage of the signal line 450, which may include detecting a drop in $V_{sig}$ (e.g., a change in $V_{sig}$, a time derivative or voltage of $V_{sig}$) or comparing $V_{sig}$ to a threshold (e.g., $V_{T,leak}$, a charge detection reference voltage, which may be a configurable voltage that is different than a value of $V_{ref}$ used by the sense amplifier 440 for evaluating a logic state stored by the memory cell 205-a). In some examples, the leakage detection component 270-a may be configured to detect a change in $V_{sig}$ while the signal line 450 is isolated from the sense amplifier 440 (e.g., while the logical signal $ISO_1$ is deactivated). In some examples, the signal line 450 may be coupled with the sense amplifier 440 (e.g., by activating the switching component 420-g via logical signal $ISO_1$) to support a charge leakage evaluation by the sense amplifier 440. The evaluation of 508 may be an example of evaluating an electrical characteristic of an access line (e.g., signal line 450) based at least in part on applying a bias to an access line (e.g., a biasing of any one or more of the operations of 502, 504, or 506, a biasing via any one or more of voltage sources 410-c, 410-d, 410-f, 410-g). In some examples, the evaluation of 508 may be an example of evaluating an electrical characteristic of an access line (e.g., signal line 450) based at least in part on removing a bias from an access line (e.g., the disconnection of voltage source 410-d at 505, a disconnection of voltage source 410-c from the digit line 215-a).

In some examples, a leakage detection or evaluation may be performed at the integrator capacitor 430-a, which may be associated with detecting a voltage or change in voltage across the integrator capacitor 430-a, or detecting a charge state or change in charge state of the integrator capacitor 430-a. In other examples, a leakage detection or evaluation may be performed at the digit line 215-a, which may be associated with detecting a voltage or change in voltage across the intrinsic capacitance 405, or detecting a charge state or change in charge state of the intrinsic capacitance 405. In some examples, a leakage detection or evaluation may be performed by monitoring a charge flow across the amplifier 415, or other portion of the circuit 400, which may be supported when the voltage source 410-d is decoupled from the signal line 450 (e.g., as illustrated, where charge flow may be supported via discharge of the integrator capacitor 430-a), or when the voltage source 410-d is coupled with the signal line 450 (e.g., by omitting the operations of at least 505, where charge flow may be supported via the voltage source 410-d). In some examples, the leakage detection component 270-a, or some other component, may store an indication of whether leakage was detected at 508 (e.g., a temporary indication associated with the access operation of timing diagram 500, a cell-specific indication, an access line-specific indication).

In some examples, a charge leakage evaluation may include detecting a difference between the signal line voltage, $V_{sig}$ and a reference voltage (e.g., $V_{T,leak}$), which may be referred to as "latching" the result of a leakage charge integration. For example, if the voltage of the signal line 450 is greater than or equal to $V_{T,leak}$, the sense amplifier 440 may output a voltage or other indication that charge leakage is below a threshold, or otherwise satisfies criteria indicating normal or acceptable operation. If the voltage of the signal line 450 is less than or equal to $V_{T,leak}$, the sense amplifier 440 may output a voltage or other indication that charge leakage is above a threshold, or otherwise satisfies criteria indicating abnormal or unacceptable operation (e.g., a precursor for impending failures or other reliability degradation). An indication of detected leakage state may be output to an input/output component 260 (e.g., for forwarding to a host device 105), to a local memory controller 165 or 265, to a device memory controller 155, or other to components of a memory device 110 that includes the circuit 400 for subsequent operations (e.g., recovery operations, preventative measures).

At 509, the access procedure may include deactivating switching component 420-d (e.g., by deactivating logical signal SW$_4$). Deactivating switching component 420-d may cause a transition from the voltage source 410-g being coupled with the second terminal 432-a of the integrator capacitor 430-a to the voltage source 410-f being coupled with the second terminal 432-a of the integrator capacitor 430-a. By connecting the second terminal 432-a of the integrator capacitor 430-a to the voltage source at a lower voltage, the charge stored by the integrator capacitor 430-b may be shifted to a lower voltage, and accordingly the voltage of signal line 450, coupled with the first terminal 431-a of the integrator capacitor 430-a, may drop by voltage level of ($V_6-V_5$), or just $V_6$ in the event that voltage source 410-f is coupled with a common ground point. Thus, deactivating switching component 420-d may initiate a shifting operation for the integrator capacitor 430-a, which may reduce the voltage of the signal line 450.

At 510, the access operation may include performing a write operation (e.g., a write portion of the access operation, a rewrite portion of the access operation). For example, returning to the example of hysteresis plot 300-a, at 510, the access operation may include applying a voltage 315 (e.g., a plate low write voltage, where $V_{DL,w1}>V_{PL,w1}$) when the memory cell 205-a is to store a logic 1, or the access operation may include applying a voltage 325 (e.g., a plate high write voltage, where $V_{PL,w0}>V_{DL,w0}$) when the memory cell 205-a is to store a logic 0. However, when the operations of 501 through 503 are associated with writing a logic 1 (e.g., as part of writing a diagnostic state for the charge leakage detection evaluation), operations associated with writing a logic 1 may be omitted from the operations of 510.

Moreover, in some examples, the memory cell 205-a may not be intended to store user data, or a particular pattern of data, such as when the operations of timing diagram 500 are associated with a wear leveling or other memory management operation. Thus, in some examples, the operations of 510 may not include a write operation, and may instead be associated with a modified PRE sequence in which the associated row is closed (e.g., deactivating logical signal WL) without a corresponding write operation. In some examples, the operations of timing diagram 500 may thus be advantageously embedded into memory management techniques, such as wear leveling techniques, to evaluate charge leakage by accessing cells that are not intended to be storing user information, which may support the omission of write operations at 510 (e.g., in a modified PRE sequence in which a page is closed without a corresponding write-back operation). In such examples, performing charge leakage evaluation techniques such as those described with reference to timing diagram 500 may be associated with writing memory cells 205 to a particular state (e.g., the diagnostic state of the leakage evaluation operations, an "all logic 1" memory management operation).

The order of operations shown in timing diagram 500 is for illustration purposes, and various other orders and combinations of steps may be performed to support the described techniques. Further, the timing of the operations of timing diagram 500 is also for illustration purposes, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 500 are illustrative of transitions from one state to another, and generally reflect transitions between an enabled or activated state (e.g., state "0") and a disabled or deactivated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a curve over time from one logical state to another.

Thus, the transitions shown in timing diagram 500 are not necessarily indicative of an instantaneous transition. Further, the initial state of a logical signal associated with a transition at a numbered operation may have been arrived during various times preceding the numbered operation while still supporting the described transitions and associated operations.

Although the techniques of timing diagram 500 are described with reference to a single memory cell 205 (e.g., a single digit line 215, a single signal line 450), leakage evaluation techniques may be performed on any quantity of memory cells 205 or access lines or a memory array 170. For example, the operations of timing diagram 500, or other techniques in accordance with examples as disclosed herein, may be performed on each memory cell 205 or each digit line 215 of an opened page (e.g., activated word line 210), or some subset thereof (e.g., according to a column multiplexing scheme). In some examples, the operations of timing diagram 500, or other techniques in accordance with examples as disclosed herein, may be performed using each sense amplifier 440 of a set of sense amplifiers 440 included in a sense component 250. In various examples, corresponding operations on respective memory cells 205, access lines of a memory array, or sense amplifiers 440 may be performed concurrently, or according to staggered timing.

Although the timing diagram 500 is described with reference to a single diagnostic state (e.g., associated with a logic 1), the operations of timing diagram 500 may use different diagnostic states, or patterns of diagnostic states, or other techniques for zeroing or canceling displacement or other variations, which may or may not be associated with a particular logic state. In various examples, a diagnostic state or biasing for leakage evaluation may be the same as a state or biasing for a read operation (e.g., a 2Pr read operation), or may be different than those associated with a read operation (e.g., applying a voltage 335 for read operations, and applying a voltage having a same magnitude but opposite polarity as voltage 335 for leakage evaluations). In some examples, a diagnostic state or biasing may be the same for each digit line 215 or signal line 450 of a page, or may be different for respective ones of the digit lines 215 or signal lines 450 of a page. Moreover, in some examples, a diagnostic state or biasing may change over time, such as alternating between successive leakage evaluations.

Although the techniques of timing diagram 500 are described with reference to a capacitive memory architecture, leakage evaluation techniques may be employed in other memory architectures to identify precursors of reliability issues. For example, leakage evaluation in accordance with examples disclosed herein may include various techniques for zeroing or canceling variance that may be associated with memory cells 205 storing different states (e.g., logic states, material states), biasing associated access lines (e.g., charging an intrinsic of component-based capacitance), and evaluating an electrical characteristic after removing such a bias. In other examples, a biasing may be maintained, and leakage charge may be integrated in the presence of a maintained biasing. Such techniques may include various operations for establishing a baseline or diagnostic condition for various access lines or memory cells 205, which may support the use of a single charge evaluation reference condition (e.g., reference voltage) from which to distinguish between normal operation and a possible precursor for reliability issues caused by cell leakage.

Figure 6:
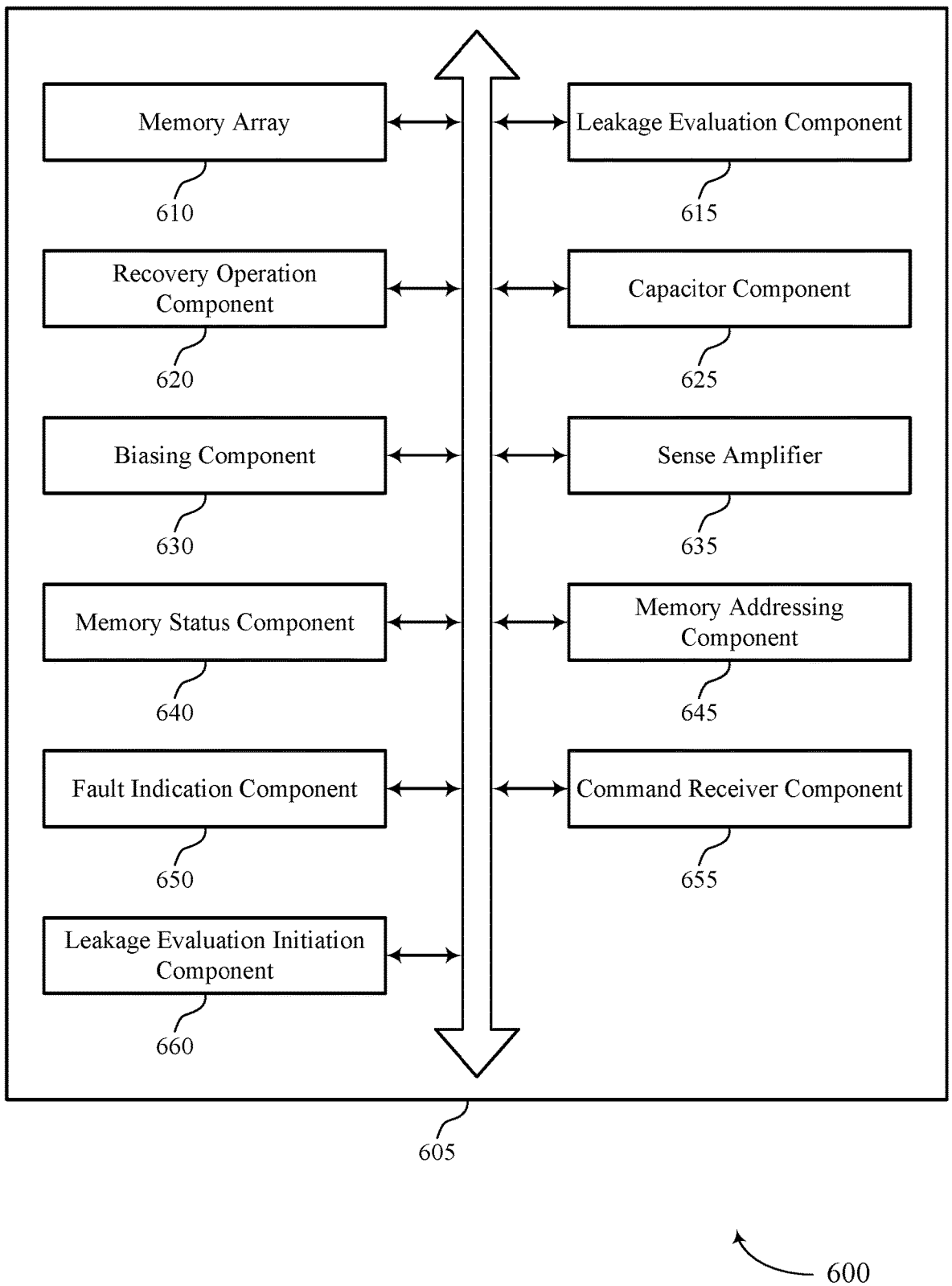
FIG. 6 shows a block diagram of a memory device that supports charge leakage detection for memory system reliability in accordance with aspects of the present disclosure.

FIG. 6 shows a block diagram 600 of a memory device 605 that supports charge leakage detection for memory system reliability in accordance with examples as disclosed herein. The memory device 605 may be an example of aspects of a memory device as described with reference to FIGS. 1 through 5. The memory device 605 may include a memory array 610, a leakage evaluation component 615, a recovery operation component 620, a capacitor component 625, a biasing component 630, a sense amplifier 635, a memory status component 640, a memory addressing component 645, a fault indication component 650, a command receiver component 655, and a leakage evaluation initiation component 660. Each of these modules may communicate, directly or indirectly, with one another (e.g., via one or more buses).

The memory array 610 may be an example of a memory array 170 described with reference to FIG. 1. The memory array 610 may include an array of memory cells, such as memory cells 205 described with reference to FIG. 2. The memory array may include sets of access lines, such as a set of word lines 210, a set of digit lines 215, and a set of plate lines 220, or other plate nodes or common plate of the memory array 610.

The leakage evaluation component 615 may perform a leakage detection evaluation for the memory array 610 to determine a leakage condition of the memory array 610. In some examples, the leakage detection evaluation may include applying a bias (e.g., using the biasing component 630) to an access line of the memory array 610, the access line coupled with a memory cell, and evaluating an electrical characteristic of the access line based at least in part on applying the bias to the access line to determine a leakage condition of the memory array 610. In some examples, the leakage detection evaluation may include removing the bias from the access line and evaluating the electrical characteristic of the access line after removing the bias from the access line to determine the leakage condition of the memory array 610.

In some cases (e.g., as part of a leakage detection evaluation performed by the leakage evaluation component 615), a diagnostic charge state may be written to the memory cell based on applying a bias to the access line.

In some cases (e.g., as part of a leakage detection evaluation performed by the leakage evaluation component 615), applying a bias to the access line may include charging a capacitor (e.g., capacitor component 625) that is coupled with the access line.

In some examples (e.g., as part of biasing the access line), the leakage evaluation component 615 may decouple a voltage source (e.g., biasing component 630) from the access line after charging the capacitor, and may recharge the capacitor that is coupled with the access line (e.g., using the biasing component 630) after decoupling the voltage source from the access line.

In some examples, removing the bias from the access line may include electrically floating the access line.

In some examples, to evaluate the electrical characteristic of the access line, the leakage evaluation component 615 may integrate a charge leakage associated with the access line.

In some examples, to evaluate the electrical characteristic of the access line, the leakage evaluation component 615 may compare a voltage of the access line to a voltage threshold.

In some examples, the leakage evaluation component 615 may perform the leakage detection evaluation based on a set of one or more memory cells that, according to a wear leveling operation, are not storing user data.

The recovery operation component 620 may initiate a recovery operation based on the determined leakage condition of the memory array.

In some examples, to compare a voltage of the access line to the voltage threshold (e.g., as part of an evaluation of the access line to determine a leakage condition), the sense amplifier 635 may compare the voltage of the access line to a reference voltage. In some examples, the sense amplifier 635 may be operable to detect a logic state stored by the memory cell (e.g., in a read operation).

In some examples, the sense amplifier 635 may compare the voltage of the access line to a first reference voltage (e.g., a leakage detection reference voltage, a leakage state demarcation voltage) that is different than a second reference voltage for detecting the logic state stored by the memory cell (e.g., a read operation reference voltage, a logic state demarcation voltage).

In some examples (e.g., based on the recovery operation component 620 initiating a recovery operation), the memory status component 640 may store a fault indication for an address of the memory array 610 that includes the access line.

In some examples (e.g., based on the recovery operation component 620 initiating a recovery operation), the memory addressing component 645 may remap an address of the memory array that includes the access line to a different address of the memory array.

In some examples (e.g., based on the recovery operation component 620 initiating a recovery operation), the fault indication component 650 may indicate, to a host device in communication with the memory array 610 (e.g., in communication with the memory device 605), a fault condition for an address of the memory array 610 that includes the access line.

In some examples (e.g., to support host-initiated leakage evaluation), the command receiver component 655 may receive, from a host device coupled with the memory device 605, a command to perform the leakage detection evaluation for the memory array 610.

In some examples (e.g., to support memory device-initiated leakage evaluation), the leakage evaluation initiation component 660 may determine to perform the leakage detection evaluation for the memory array 610 based on an operating condition (e.g., a diagnostic condition, a diagnostic mode, a trigger condition, a periodic leakage evaluation operation) of the memory device 605.

In some examples (e.g., to support memory device-initiated leakage evaluation), the leakage evaluation initiation component 660 may determine to perform the leakage detection evaluation for the memory array 610 based on performing a wear leveling operation on the memory array (e.g., inserting leakage evaluation operations in the wear leveling operation).

Figure 7:
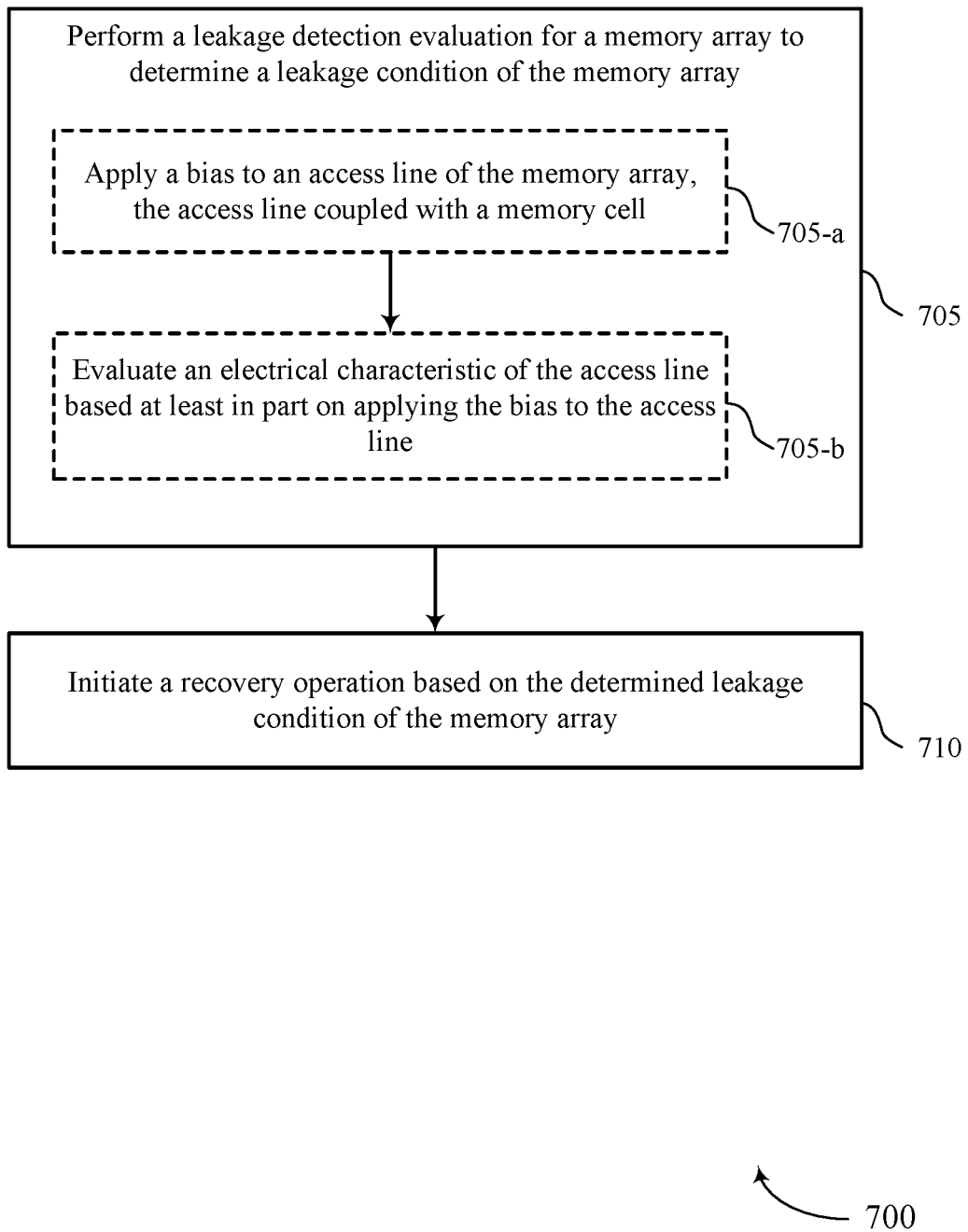
FIG. 7 shows a flowchart illustrating a method or methods that support charge leakage detection for memory system reliability in accordance with examples as disclosed herein.

FIG. 7 shows a flowchart illustrating a method or methods 700 that supports charge leakage detection for memory system reliability in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally, or alternatively, a memory device may perform aspects of the described functions using special-purpose hardware.

At 705, the memory device may perform a leakage detection evaluation for a memory array (e.g., to determine a leakage condition of the memory array). The leakage detection evaluation may include various operations in accordance with examples as disclosed herein. For example, at 705-*a*, the leakage detection evaluation may include applying a bias to an access line of the memory array, the access line coupled with a memory cell. At 705-*b*, the leakage detection evaluation may include evaluating an electrical characteristic of the access line based at least in part on applying the bias to the access line (e.g., to determine the leakage condition of the memory array). In some examples, the leakage detection evaluation may include removing the bias from the memory cell, and evaluating the electrical characteristic of the access line after removing the bias from the access line (e.g., to determine the leakage condition of the memory array). The operations of 705 may be performed according to the methods described herein. In some examples, aspects of the operations of 705 may be performed by a leakage evaluation component as described with reference to FIG. 6.

At 710, the memory device may initiate a recovery operation based on the determined leakage condition of the memory array. The operations of 710 may be performed according to the methods described herein. In some examples, aspects of the operations of 710 may be performed by a recovery operation component as described with reference to FIG. 6.

In some examples, an apparatus as described herein may perform a method or methods, such as the method 700. The apparatus may include features, circuitry, means, or instructions (e.g., a non-transitory computer-readable medium storing instructions executable by a processor) for performing a leakage detection evaluation for a memory array to determine a leakage condition of the memory array, and initiating a recovery operation based on the determined leakage condition of the memory array. In some examples, the leakage detection evaluation may include applying a bias to an access line of the memory array (e.g., coupled with a memory cell), and evaluating an electrical characteristic of the access line based at least in part on applying the bias to the access line (e.g., to determine the leakage condition of the memory array). In some examples, the leakage detection evaluation may include removing the bias from the memory cell, and evaluating the electrical characteristic of the access line after removing the bias from the access line (e.g., to determine the leakage condition of the memory array).

In some examples of the method 700 and the apparatus described herein, a diagnostic charge state may be written to the memory cell based on applying the bias to the access line.

In some examples of the method 700 and the apparatus described herein, applying the bias to the access line may include operations, features, circuitry, means, or instructions for charging a capacitor that is coupled with the access line.

In some examples of the method 700 and the apparatus described herein, applying the bias to the access line may include operations, features, circuitry, means, or instructions for decoupling a voltage source from the access line after charging the capacitor that is coupled with the access line, and recharging the capacitor that is coupled with the access line after decoupling the voltage source from the access line.

In some examples of the method 700 and the apparatus described herein, removing the bias from the access line may include operations, features, circuitry, means, or instructions for electrically floating the access line.

In some examples of the method 700 and the apparatus described herein, evaluating the electrical characteristic of the access line may include operations, features, circuitry, means, or instructions for integrating a charge leakage associated with the access line.

In some examples of the method 700 and the apparatus described herein, evaluating the electrical characteristic of the access line may include operations, features, circuitry, means, or instructions for comparing a voltage of the access line to a voltage threshold.

In some examples of the method 700 and the apparatus described herein, comparing the voltage of the access line to the voltage threshold may include operations, features, circuitry, means, or instructions for comparing, using a sense amplifier operable to detect a logic state stored by the memory cell, the voltage of the access line to a reference voltage.

In some examples of the method 700 and the apparatus described herein, the comparing using the sense amplifier may include operations, features, circuitry, means, or instructions for comparing the voltage of the access line to a first reference voltage that is different than a second reference voltage for detecting the logic state stored by the memory cell.

In some examples of the method 700 and the apparatus described herein, initiating the recovery operation may include operations, features, circuitry, means, or instructions for storing a fault indication for an address of the memory array that includes the access line.

In some examples of the method 700 and the apparatus described herein, initiating the recovery operation may include operations, features, circuitry, means, or instructions for remapping an address of the memory array that includes the access line to a different address of the memory array.

In some examples of the method 700 and the apparatus described herein, initiating the recovery operation may include operations, features, circuitry, means, or instructions for indicating, to a host device in communication with the memory array, a fault condition for an address of the memory array that includes the access line.

Some examples of the method 700 and the apparatus described herein may further include operations, features, circuitry, means, or instructions for receiving, from a host device coupled with a memory device that includes the memory array, a command to perform the leakage detection evaluation for the memory array.

Some examples of the method 700 and the apparatus described herein may further include operations, features, circuitry, means, or instructions for determining, at a memory device that includes the memory array, to perform the leakage detection evaluation for the memory array based on an operating condition of the memory device.

Some examples of the method 700 and the apparatus described herein may further include operations, features, circuitry, means, or instructions for determining, at a memory device that includes the memory array, to perform the leakage detection evaluation for the memory array based on performing a wear leveling operation on the memory array.

Some examples of the method 700 and the apparatus described herein may further include operations, features, circuitry, means, or instructions for performing the leakage detection evaluation may be based on a set of one or more memory cells that, according to the wear leveling operation, are not storing user data.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array, a leakage detection component coupled with the memory array, and a memory management component coupled with the leakage detection component. In some examples, the leakage detection component may be configured for applying a bias to an access line of the memory array that is coupled with a memory cell, evaluating an electrical characteristic of the access line based at least in part on applying the bias to the access line, and determining a charge leakage condition of the memory array based at least in part on evaluating the electrical characteristic. In some examples, the leakage detection component may be configured for removing the bias from the access line, and evaluating the electrical characteristic of the access line after removing the bias from the access line. In some examples, the memory management component may be configured to initiate a recovery operation of the apparatus based on a determined charge leakage condition.

In some examples, to evaluate the electrical characteristic of the access line, the leakage detection component may be configured to integrate a charge leakage associated with the access line.

In some examples, to evaluate the electrical characteristic of the access line, the leakage detection component may be configured to compare a voltage of the access line to a voltage threshold.

In some examples, the leakage detection component includes a sense amplifier configured to detect a logic state stored by the memory cell, and the sense amplifier may be additionally configured to compare the voltage of the access line to the voltage threshold.

In some examples, to evaluate the electrical characteristic of the access line, the sense amplifier may be configured to compare the voltage of the access line to a first reference voltage that is different than a second reference voltage for detecting the logic state stored by the memory cell.

In some examples, the memory management component may be configured to store a fault indication for an address of the memory array that includes the access line based on a determined charge leakage condition.

In some examples, the memory management component may be configured to remap an address of the memory array that includes the access line to a different address of the memory array based on a determined charge leakage condition.

In some examples, the memory management component may be configured to indicate, to a host device in communication with the memory array, a fault condition for an address of the memory array that includes the access line based on the determined charge leakage condition.

An apparatus is described. The apparatus may include a memory array and a memory controller coupled with the memory array. The memory controller may be configured to perform a leakage detection evaluation for the memory array, and initiate a recovery operation based at least in part on the determined leakage condition of the memory array. In some examples, to perform the leakage detection evaluation, the memory controller may be operable to cause the apparatus to apply a bias to an access line of the memory array that is coupled with a memory cell, and evaluate an electrical characteristic of the access line based at least in part on applying the bias to the access line. In some examples, the electrical characteristic may be indicative of a leakage condition of the memory array. In some examples, to perform the leakage detection evaluation, the memory controller may be operable to remove the bias from the access line, and evaluate the electrical characteristic of the access line after the bias is removed from the access line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory array; and
   circuitry coupled with the memory array and configured to:
   perform a leakage detection evaluation of the memory array, wherein, to perform the leakage detection evaluation, the circuitry is configured to:
   establish a diagnostic condition of a memory cell of the memory array; and
   determine a leakage condition of the memory array, after establishing the diagnostic condition of the memory cell, based at least in part on evaluating an electrical characteristic of an access line coupled with the memory cell; and
   initiate a recovery operation based at least in part on the determined leakage condition of the memory array.

2. The apparatus of claim 1, wherein, to establish the diagnostic condition of the memory cell, the circuitry is configured to:
   write the memory cell with a logic state associated with the leakage detection evaluation.

3. The apparatus of claim 1, wherein, to establish the diagnostic condition of the memory cell, the circuitry is configured to:
   write the memory cell with a polarization state associated with the leakage detection evaluation.

4. The apparatus of claim 1, wherein, to establish the diagnostic condition of the memory cell, the circuitry is configured to:
   write the memory cell with a material state associated with the leakage detection evaluation.

5. The apparatus of claim 1, wherein, to establish the diagnostic condition of the memory cell, the circuitry is configured to:
   charge a capacitance associated with the access line with a voltage associated with the leakage detection evaluation.

6. The apparatus of claim 1, wherein, to initiate the recovery operation, the circuitry is configured to:
   store a fault indication for an address of the memory array that includes the access line based at least in part on determining the leakage condition.

7. The apparatus of claim 1, wherein, to initiate the recovery operation, the circuitry is configured to:
   remap an address of the memory array that includes the access line to a different address of the memory array based at least in part on determining the leakage condition.

8. The apparatus of claim 1, wherein, to initiate the recovery operation, the circuitry is configured to:
   indicating, to a host device in communication with the memory array, a fault condition for an address of the memory array that includes the access line based at least in part on determining the leakage condition.

9. A method, comprising:
   performing a leakage detection evaluation of a memory array, the leakage detection evaluation comprising:
   establishing a diagnostic condition of a memory cell of the memory array; and
   determining a leakage condition of the memory array, after establishing the diagnostic condition of the memory cell, based at least in part on evaluating an electrical characteristic of an access line coupled with the memory cell; and
   initiating a recovery operation based at least in part on the determined leakage condition of the memory array.

10. The method of claim 9, wherein establishing the diagnostic condition of the memory cell comprises:
    writing the memory cell with a logic state associated with the leakage detection evaluation.

11. The method of claim 9, wherein establishing the diagnostic condition of the memory cell comprises:
    writing the memory cell with a polarization state associated with the leakage detection evaluation.

12. The method of claim 9, wherein establishing the diagnostic condition of the memory cell comprises:
    writing the memory cell with a material state associated with the leakage detection evaluation.

13. The method of claim 9, wherein establishing the diagnostic condition of the memory cell comprises:
    charging a capacitance associated with the access line with a voltage associated with the leakage detection evaluation.

14. The method of claim 9, wherein initiating the recovery operation comprises:
    indicating, to a host device in communication with the memory array, a fault condition for an address of the memory array that includes the access line based at least in part on determining the leakage condition.

15. An apparatus, comprising:
    a memory array; and
    circuitry coupled with the memory array and configured to:

receive a command associated with performing a leakage detection evaluation of the memory array;

evaluate an electrical characteristic of an access line of the memory array based at least in part on receiving the command; and transmit an indication of a detected leakage condition based at least in part on evaluating the electrical characteristic of the access line.

16. The apparatus of claim 15, wherein the circuitry is configured to:

evaluate the electrical characteristic of the access line based at least in part on comparing a voltage of the access line to a threshold; and transmit the indication of the detected leakage condition based at least in part on the comparison of the voltage of the access line to the threshold.

17. The apparatus of claim 15, wherein the circuitry is configured to:

evaluate the electrical characteristic of the access line based at least in part on integrating a charge leakage associated with the access line; and transmit the indication of the detected leakage condition based at least in part on the integrated charge leakage satisfying a threshold.

18. The apparatus of claim 15, wherein the circuitry is configured to:

establish a diagnostic condition of a memory cell of the memory array that is coupled with the access line; and evaluate an electrical characteristic of the access line based at least in part on establishing the diagnostic condition of the memory cell.

19. The apparatus of claim 15, wherein the circuitry is configured to:

decouple the access line from a sense amplifier during the evaluation of the electrical characteristic of the access line.

20. The apparatus of claim 15, wherein the circuitry is configured to:

perform a read operation, a rewrite operation, or both based at least in part on receiving the command.

* * * * *